US012596136B2

(12) United States Patent
Treibergs

(10) Patent No.: US 12,596,136 B2
(45) Date of Patent: Apr. 7, 2026

(54) SPRING PROBE ASSEMBLY FOR A KELVIN TESTING SYSTEM

(71) Applicant: Johnstech International Corporation, Minneapolis, MN (US)

(72) Inventor: Valts Treibergs, White Bear Township, MN (US)

(73) Assignee: Johnstech International Corporation, Minneapolis, MN (US)

( * ) Notice: Subject to any disclaimer, the term of this patent is extended or adjusted under 35 U.S.C. 154(b) by 486 days.

(21) Appl. No.: 18/163,652

(22) Filed: Feb. 2, 2023

(65) Prior Publication Data

US 2023/0258688 A1    Aug. 17, 2023

Related U.S. Application Data

(60) Provisional application No. 63/307,469, filed on Feb. 7, 2022.

(51) Int. Cl.
*G01R 1/067*      (2006.01)
*G01R 1/073*      (2006.01)
(52) U.S. Cl.
CPC ..... *G01R 1/06722* (2013.01); *G01R 1/06744* (2013.01); *G01R 1/07314* (2013.01)
(58) Field of Classification Search
CPC ...... G01R 1/02; G01R 1/0441; G01R 1/0466; G01R 1/06; G01R 1/067; G01R 1/06705; G01R 1/06711; G01R 1/06716; G01R 1/06722; G01R 1/06733; G01R 1/06738;
(Continued)

(56) References Cited

U.S. PATENT DOCUMENTS

| | | | |
|---|---|---|---|
| 6,084,421 A | 7/2000 | Swart et al. | |
| 6,271,672 B1 * | 8/2001 | Swart ................. | G01R 1/06738 |
| | | | 324/755.05 |
| 7,074,049 B2 | 7/2006 | O'Sullivan et al. | |

(Continued)

FOREIGN PATENT DOCUMENTS

| | | |
|---|---|---|
| CN | 307058535 | 1/2022 |
| EP | 009108590-0001 | 12/2022 |

(Continued)

OTHER PUBLICATIONS

U.S. Appl. No. 63/188,226, filed May 13, 2021.
(Continued)

*Primary Examiner* — Huy Q Phan
*Assistant Examiner* — David B Frederiksen
(74) *Attorney, Agent, or Firm* — HSML P.C.

(57) ABSTRACT

A spring probe assembly for a Kelvin testing system for testing integrated circuit devices is disclosed. The assembly includes a force spring probe and a sense spring probe. Each of the force spring probe and the sense spring probe includes a head; a body containing at least one resilient element; and a bottom. The body has a cylindrical shape, and the head and the body have a same diameter in an end view. The head includes a base and a top integrated with the base. The base has a cylindrical shape. The head includes a shoulder between the base and the top. The top includes an apex. The force spring probe and the sense spring probe are disposed so that the apexes of the force spring probe and the sense spring probe are adjacent to each other.

20 Claims, 19 Drawing Sheets

(58) Field of Classification Search

CPC ........................... G01R 1/06744; G01R 1/073; G01R 1/07307; G01R 1/07314

See application file for complete search history.

(56) References Cited

U.S. PATENT DOCUMENTS

| | | | |
|---|---|---|---|
| 7,116,121 B1 | 10/2006 | Holcombe et al. | |
| 7,255,576 B2 | 8/2007 | O'Sullivan et al. | |
| 7,256,593 B2 | 8/2007 | Treibergs | |
| 7,298,153 B2 | 11/2007 | Farris et al. | |
| D580,360 S | 11/2008 | Vitito | |
| D580,866 S | 11/2008 | Vitito | |
| D596,137 S | 7/2009 | Sakamoto | |
| D605,596 S | 12/2009 | Sakamoto | |
| D664,927 S | 8/2012 | Yamauchi et al. | |
| D664,928 S | 8/2012 | Yamauchi et al. | |
| D665,359 S | 8/2012 | Yamauchi et al. | |
| D665,744 S | 8/2012 | Yamauchi et al. | |
| D665,745 S | 8/2012 | Yamauchi et al. | |
| 8,354,854 B2 | 1/2013 | Sherry | |
| 8,460,010 B2 | 6/2013 | Kimura et al. | |
| 8,558,554 B2 | 10/2013 | Erdman et al. | |
| D711,326 S | 8/2014 | Shibutani | |
| 8,988,090 B2 | 3/2015 | Erdman et al. | |
| 9,328,201 B2 | 5/2016 | Ebert et al. | |
| D769,748 S | 10/2016 | Teranishi et al. | |
| D769,749 S | 10/2016 | Teranishi et al. | |
| 9,500,673 B2 | 11/2016 | Erdman et al. | |
| 9,606,143 B1 | 3/2017 | Sherry | |
| D829,296 S | 9/2018 | Cross | |
| 10,078,101 B2 * | 9/2018 | Edwards | G01R 3/00 |
| 10,197,599 B2 * | 2/2019 | Hiew | G01R 1/06738 |
| D847,091 S | 4/2019 | Bureacov et al. | |
| 10,247,755 B2 | 4/2019 | Erdman et al. | |
| D860,137 S | 9/2019 | Ishiguro et al. | |
| D971,162 S | 11/2022 | Fujitani et al. | |
| D1,015,282 S | 2/2024 | Treibergs | |
| 2002/0113612 A1 | 8/2002 | Nguyen | |
| 2007/0018666 A1 | 1/2007 | Barabi et al. | |
| 2008/0042676 A1 * | 2/2008 | Yamada | G01R 1/07314 324/755.05 |
| 2011/0057676 A1 | 3/2011 | Ho et al. | |
| 2012/0182036 A1 * | 7/2012 | Yamamoto | G01R 1/06722 324/754.11 |
| 2013/0099812 A1 | 4/2013 | Wang et al. | |
| 2015/0070040 A1 | 3/2015 | Treibergs et al. | |
| 2015/0160265 A1 | 6/2015 | Nakamura et al. | |
| 2016/0216294 A1 * | 7/2016 | Kaashoek | G01R 1/06722 |
| 2017/0074926 A1 | 3/2017 | Edwards et al. | |
| 2017/0176494 A1 | 6/2017 | Hiew et al. | |
| 2018/0003767 A1 | 1/2018 | Crippa et al. | |
| 2020/0116755 A1 * | 4/2020 | Bae | G01R 31/2831 |
| 2020/0119481 A1 | 4/2020 | Struyk | |
| 2020/0256891 A1 * | 8/2020 | Williams | H01R 31/005 |
| 2021/0199692 A1 | 7/2021 | Jun et al. | |
| 2023/0258688 A1 | 8/2023 | Treibergs | |

FOREIGN PATENT DOCUMENTS

| | | |
|---|---|---|
| EP | 009108590-0002 | 12/2022 |
| IL | 69160 | 2/2022 |
| MT | 1617-0001 | 2/2022 |
| NO | 20220000006990001 | 2/2022 |
| TW | M576732 U | 4/2019 |
| TW | 226888-0001 | 8/2023 |

OTHER PUBLICATIONS

International Search Report and Written Opinion, International Patent Application No. PCT/US23/61848, PCT/US2023/61848 (18 pages).

* cited by examiner

*Fig. 11C*
*Fig. 11D*
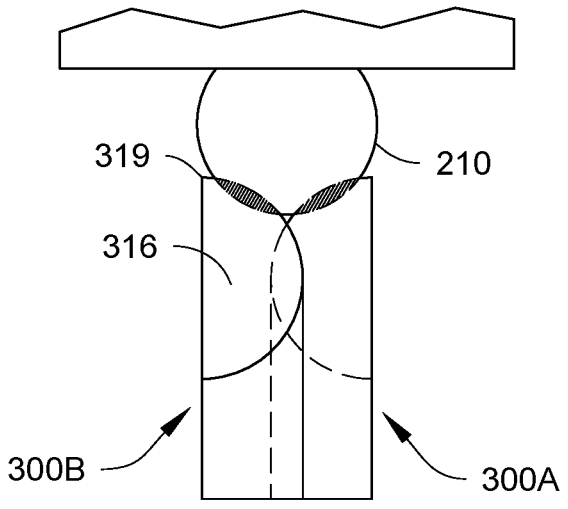
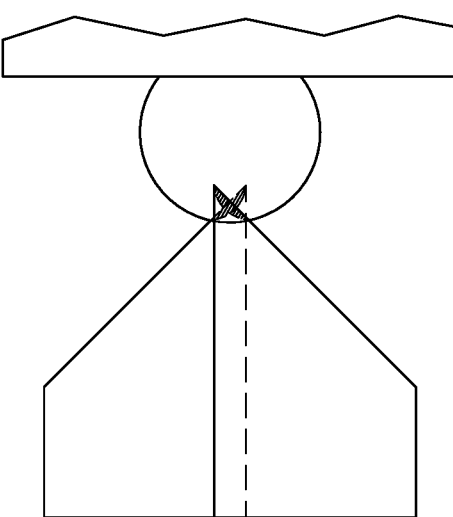
*Fig. 11E*
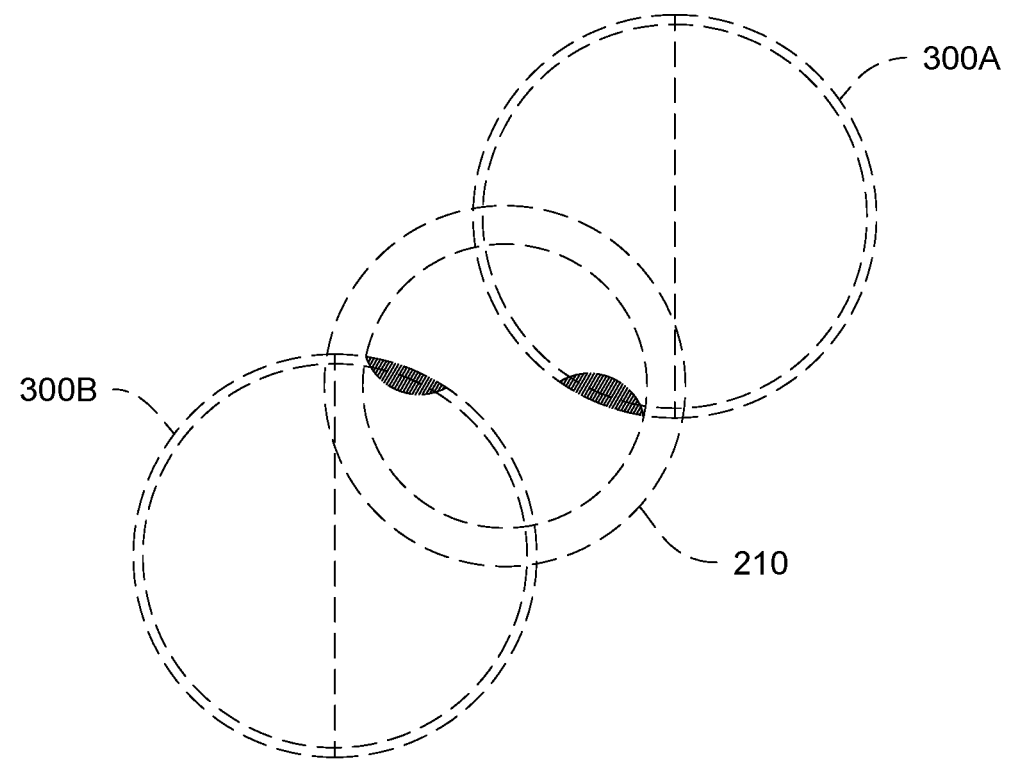

702
710A
300A
L
300B 300B
300A
702

SPRING PROBE ASSEMBLY FOR A KELVIN TESTING SYSTEM

TECHNICAL FIELD

This disclosure relates generally to the field of testing microcircuits (e.g., chips such as semiconductor devices, integrated circuits, etc.). More specifically, the disclosure relates to a spring probe assembly that provide electrical connection to a device under test (DUT) by making contact to a load board of a Kelvin testing system, and relates to Kelvin testing systems having the spring probe assembly.

BACKGROUND

The manufacturing processes for microcircuits cannot guarantee that every microcircuit is fully functional. Dimensions of individual microcircuits are microscopic and process steps very complex, so small or subtle failures in a manufacturing process can often result in defective devices. Mounting a defective microcircuit on a circuit board is relatively costly. Installation usually involves soldering the microcircuit onto the circuit board. Once mounted on a circuit board, removing a microcircuit is problematic because the very act of melting the solder for a second time may ruin the circuit board. Thus, if the microcircuit is defective, the circuit board itself is probably ruined as well, meaning that the entire value added to the circuit board at that point is lost. For all these reasons, a microcircuit is usually tested before installation on a circuit board. Each microcircuit must be tested in a way that identifies all defective devices, but yet does not improperly identify good devices as defective. Either kind of error, if frequent, adds substantial overall cost to the circuit board manufacturing process.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacing between them, even small errors in making the contact will result in incorrect connections. A further problem in microcircuit test equipment arises in automated testing. Testing equipment may test one hundred devices a minute, or even more. The sheer number of tests cause wear on the tester contacts making electrical connections to the microcircuit terminals during testing. This wear dislodges conductive debris from both the tester contacts and the device under test (DUT) terminals that contaminates the testing equipment and the DUTs themselves. The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases. Test equipment in current use has an array of test contacts that mimic the pattern of the microcircuit terminal array. The array of test contacts is supported in a structure that precisely maintains the alignment of the contacts relative to each other. An alignment board or plate or template aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

There can be a type of testing known as "Kelvin" testing, which can accurately measure the resistance between two terminals (e.g., signal and power (S&P) terminals) on the DUT. Basically, Kelvin testing involves forcing a current to flow between the two terminals, measuring the voltage difference between the two terminals, and using Ohm's Law to derive the resistance between the terminals, given as the voltage divided by the current. Each terminal on the DUT is electrically connected to two contacts and their associated pads on the load board. One of the two pads, known as the "force" connection, supplies a known amount of current. The other pad, known as the "sense" connection, is a high-impedance connection that acts as a voltmeter, which does not draw any significant amount of current. In other words, each terminal on the DUT that is to undergo Kelvin testing is simultaneously electrically connected to two pads on the load board—one pad supplying a known amount of current and the other pad measuring a voltage and drawing an insignificant amount of current while doing so. The terminals are Kelvin tested two at a time, so that a single resistance measurement uses two terminals and four contact pads.

The contacts that form the temporary electrical connections between the DUT and the load board may be used in several manners. In a "standard" test, each contact connects a particular terminal on the DUT to a particular pad on the load board, with the terminals and pads being in a one-to-one relationship. For these standard tests, each terminal corresponds to exactly one pad, and each pad corresponds to exactly one terminal. In a "Kelvin" test, there are two contacts contacting each terminal on the DUT, as described above. For these Kelvin tests, each terminal on the DUT corresponds to two pads on the load board, and each pad on the load board corresponds to exactly one terminal on the DUT. Although the testing scheme may vary, the mechanical structure and use of the contacts is essentially the same, regardless of the testing scheme.

BRIEF SUMMARY

Embodiments disclosed herein provide a solution that addresses each of the above-mentioned problems. Compared with existing technologies, embodiments disclosed herein provide a spring probe assembly that can work with a small pitch DUT device (e.g., a 0.35-millimeter pitch, a 0.3-millimeter pitch, or the like), without making skinny or small probes, for applications with shrinking packages to provide higher density, smaller packages, lighter weight, and/or lower power.

Compared with existing technologies, embodiments disclosed herein also provide a spring probe assembly and a housing that can support the spring probe assembly and prevent bending of the spring probe assembly. That is, the design disclosed herein is more rigid and resists bending. Embodiments disclosed herein can also provide a spring probe assembly and a housing that the spring probe assembly can be assembled properly.

A spring probe assembly for a Kelvin testing system for testing integrated circuit devices is disclosed. The assembly includes a force spring probe and a sense spring probe. The force spring probe and the sense spring probe may be generally identical to each other in shape and size. Each of the force spring probe and the sense spring probe preferably includes a head; a preferably body containing at least one resilient element; and a bottom. The body preferably has a cylindrical shape. The head and the body preferably have a same diameter in an end view. The head includes a base and a top integrated with the base. The base preferably has a cylindrical shape. A shape of the top is preferably defined by: cutting a cylinder by a plane containing an axis of symmetry of the cylinder to form a half-cylinder; rotating the plane 90 degrees about the axis of symmetry of the cylinder; tilting the plane at an angle with respect to a circular cross-section of the cylinder; and cutting the half-cylinder by the plane to form the shape of the top. The head preferably includes a shoulder between the base and the top. The top includes a tip and a curved edge. The force spring probe and the sense spring probe are disposed so that the tips of the force spring probe and the sense spring probe are preferably adjacent to each other.

A Kelvin testing system for testing integrated circuit devices is disclosed. The system includes a device under test, a load board, and a spring probe assembly. The assembly includes a force spring probe and a sense spring probe. The force spring probe and the sense spring probe are generally identical to each other in shape and size. Each of the force spring probe and the sense spring probe includes a head; a body containing at least one resilient element; and a bottom. The body has a cylindrical shape. The head and the body have a same diameter in an end view. The head includes a base and a top integrated with the base. The base has a cylindrical shape. A shape of the top is defined by: cutting a cylinder by a plane containing an axis of symmetry of the cylinder to form a half-cylinder; rotating the plane 90 degrees about the axis of symmetry of the cylinder; tilting the plane at an angle with respect to a circular cross-section of the cylinder; and cutting the half-cylinder by the plane to form the shape of the top. The head includes a shoulder between the base and the top. The top includes a tip and a curved edge. The force spring probe and the sense spring probe are disposed so that the tips of the force spring probe and the sense spring probe are adjacent to each other. Another way to describe the shape of the top is: the head includes a base and a top integrated with the base, the base has a cylindrical shape, a shape of the top is defined by: a cylinder bisected by a plane containing an axis of symmetry of the cylinder to form a half-cylinder; the top of the half cylinder has an tilted apex. The apex is defined by rotating the plane 90 degrees about the axis of symmetry of the cylinder; tilting the plane at an angle with respect to a circular cross-section of the cylinder; and forming a titled apex at the top of the half-cylinder.

A method of forming a spring probe assembly in a Kelvin testing system for testing integrated circuit devices is disclosed. The method includes cutting a cylinder by a plane containing an axis of symmetry of the cylinder to form a half-cylinder; rotating the plane 90 degrees about the axis of symmetry of the cylinder; tilting the plane at an angle with respect to a circular cross-section of the cylinder; cutting the half-cylinder by the plane to form a shape of a top; installing the spring probe assembly having the top into a housing from a bottom of the housing; loading the housing having the spring probe assembly onto a load board; and loading a device under test on the housing.

A method of forming a housing for a spring probe in a Kelvin testing system for testing integrated circuit devices is disclosed. The method includes forming a housing material for the spring probe; drilling or forming a hole from a bottom of the housing material; and cutting or forming a slot from a top of the housing material so that the slot intersects or partially overlaps the hole to form the housing for the spring probe. A centerline of the slot is offset from a centerline of the hole. An edge of the slot is tangent to a side of the hole. A bottom of the slot is flat.

A housing for a spring probe for a Kelvin testing system for testing integrated circuit devices is disclosed. The housing includes a hole extending from a bottom of the housing, and a slot extending from a top of the housing. The slot intersects or partially overlaps the hole. A centerline of the slot is offset from a centerline of the hole. An edge of the slot is tangent to a side of the hole. A bottom of the slot is flat.

A spring probe assembly for a Kelvin testing system for testing integrated circuit devices is disclosed. The assembly includes a force spring probe and a sense spring probe. The force spring probe and the sense spring probe are generally identical to each other in shape and size. Each of the force spring probe and the sense spring probe includes a head; a body; and a bottom. The body has a cylindrical shape. The head includes a base and a top integrated with the base. The base has a cylindrical shape. The top is a half-cylinder with a flat front portion and an angular tip portion. The angular tip portion has a chisel point apex; a curved edge extending from the apex; and a straight edge extending from the apex. The head includes a shoulder between the base and the top. The force spring probe and the sense spring probe are disposed so that the apex of the force spring probe and the apex of sense spring probe are oriented adjacent to each other.

BRIEF DESCRIPTION OF THE SEVERAL VIEWS OF THE DRAWINGS

References are made to the accompanying drawings that form a part of this disclosure and which illustrate embodiments in which the systems and methods described in this specification can be practiced.

FIG. 11C is a side perspective view of a spring assembly contacting a terminal of a DUT, according to an embodiment.

FIG. 11D is a side perspective view of FIG. 11C rotated 90 degrees, according to an embodiment.

FIG. 11E is a top perspective view of FIG. 11C, according to an embodiment.

Like reference numbers represent like parts throughout.

DETAILED DESCRIPTION

A test contactor (i.e., a part of a test assembly including alignment plate, socket, etc.) can often provide electrical connection to a DUT including e.g., S&P terminals of the DUT by making metal-to-metal contact to the printed circuit board (e.g., the load board, including e.g., S&P terminals of the load board).

The terminals of a DUT can be temporarily electrically connected to corresponding contact pads on a load board by a series of electrically conductive contacts (e.g., probes such as spring probes, blades, plates, or the like). The terminals may be pads, balls, wires (leads) or other contact points. Each terminal that undergoes Kelvin testing connects with both a "force" (current/signal/test) contact and a "sense" (voltage/Kelvin) contact, with each contact electrically connecting to a respective, single contact pad on the load board. The force contact delivers a known amount of current to or from the terminal, and the sense contact measures a voltage at the terminal and draws a negligible amount of current to or from the terminal.

In Kelvin testing, each terminal electrically contacts two contacts simultaneously. One contact in the pair supplies the known amount of current (I), as is done in conventional testing, while the other contact in the pair measures a voltage (V) without drawing a significant amount of current. From known amounts of current (I) and voltage (V), Ohm's Law (V=IR) may be used to determine the resistance R (=V/I) between two particular terminals.

The force or "current" contact may be considered a low-resistance or low-impedance contact, while the sense or "voltage" contact may be considered a high-resistance or high-impedance contact. Note that a typical voltmeter operates in a manner similar to that of the high-resistance sense or "voltage" contacts.

As defined herein, the phrase "pitch" may refer to a distance between (e.g., central points of) two adjacent terminals (or S&P pins, pads, leads, balls, lines, or the like) of a DUT. It will be appreciated that the terminals of the DUT may be pads, balls, wires (leads) or other contact points.

Figures 1A, 1B:
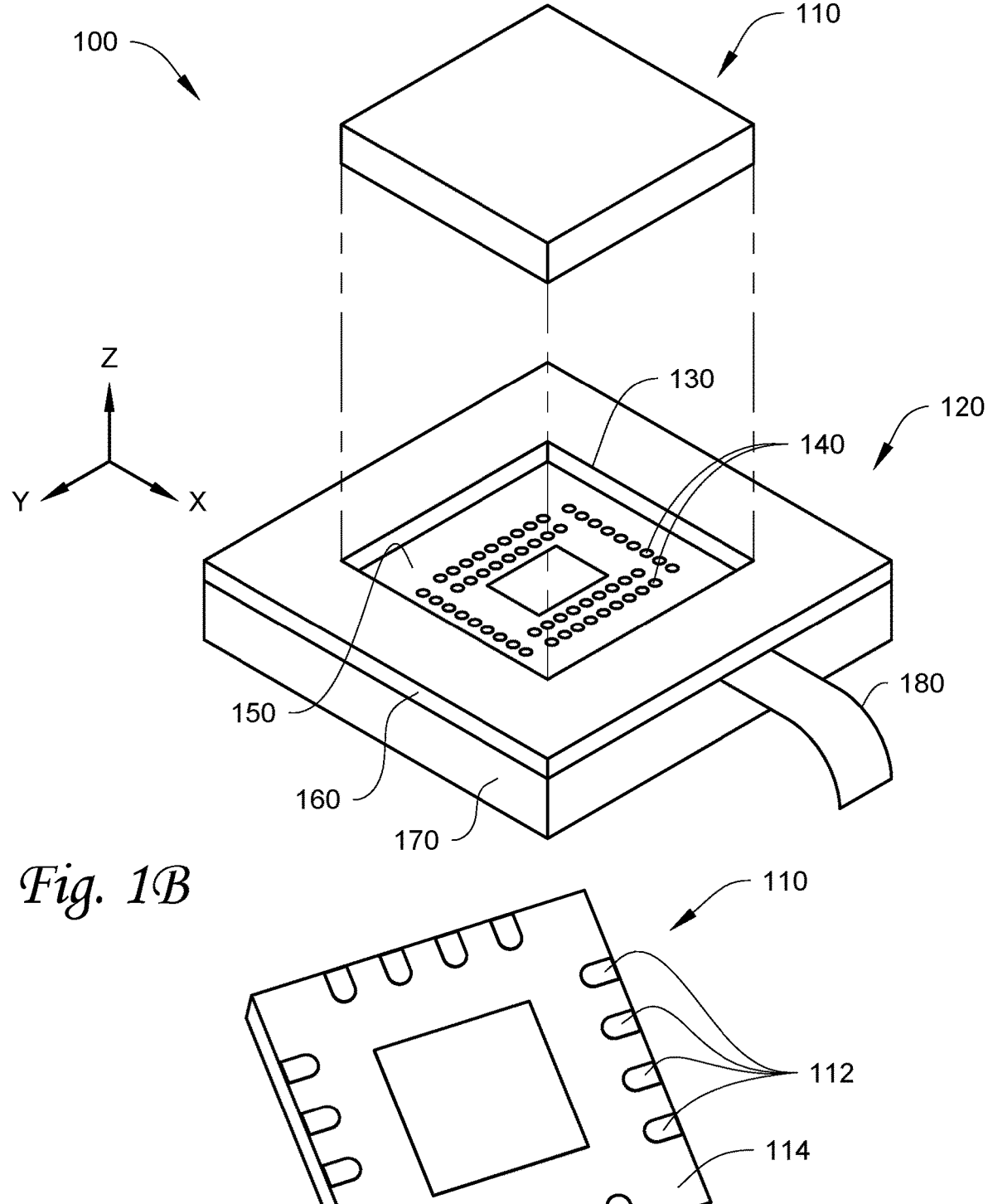
FIG. 1A is a perspective view of a part of a test system for receiving a DUT for testing, according to an embodiment.
FIG. 1B is a perspective bottom view of a DUT, according to an embodiment.

FIG. 1A is a perspective view of a part of a test system 100 for receiving a DUT 110 for testing, according to an embodiment.

The test system 100 includes a test assembly 120 for a DUT (e.g., a microcircuit, etc.) 110. The test assembly 120 includes a load board 170 that supports an alignment plate 160 having an opening or aperture 130 that precisely defines the X and Y (see the coordinate indicators X and Y, where the coordinate X is perpendicular to the coordinate Y, and the coordinate Z is perpendicular to the plane of X and Y) positioning of the DUT 110 in test assembly 120. If the DUT 110 has orientation features, it is common practice to include cooperating features in aperture 130. Load board 170 carries on its surface, connection pads connected to a cable 180 by Signal and Power (S&P) conductors. Cable 180 connects to the electronics that perform that electrical testing of the DUT 110. Cable 180 may be very short or even internal to the test assembly 120 if the test electronics are integrated with the test assembly 120, or longer if the test electronics are on a separate chassis. It will be appreciated that the cable 180 can be optional. In another embodiment, the load board can be connected to test electronics by any other suitable means, including but not limited to e.g., spring loaded/resilient element probes.

A test contact array 140 having a number of individual test contact elements precisely mirrors the S&P terminals (see 112 in FIG. 1B) carried on the surface of the DUT 110. When the DUT 110 is inserted in the aperture 130, S&P terminals of the DUT 110 precisely align with test contact array 140. The test assembly 120 is designed for compatibility with a test contact array 140 incorporating the device. Test contact array 140 is carried on a socket 150. Individual test contacts in array 140 are preferably formed on and in socket 150 using well-known photolithographic and laser machining processes. Socket 50 has alignment features such as holes or edge patterns located in the area between alignment plate 160 and load board 170 that provide for precise alignment of socket 150 with corresponding projecting features on alignment plate 160. All of the test contacts 140 are in precise alignment with the socket 150 alignment features. In this way, the test contacts of array 140 are placed in precise alignment with aperture 130.

FIG. 1B is a perspective bottom view of a DUT 110, according to an embodiment. The DUT (e.g., a microcircuit, etc.) 110 includes a top main surface (not shown), and a bottom main surface 114 opposite to the top main surface in the Z (see the coordinate indicators X, Y, and Z in FIG. 1A) direction. In one embodiment, the DUT 110 can have flat no-leads packages such as quad-flat no-leads (QFN) and dual-flat no-leads (DFN). Flat no-leads, also known as micro lead-frame (MLF) and SON (small-outline no leads), is a surface-mount technology, one of several package technologies that connect the DUT 110 to the surfaces of e.g., socket 150 or other printed circuit boards (PCBs) without through-holes. In one embodiment, flat no-lead can be a near chip scale plastic encapsulated package made with a planar copper lead frame substrate. Perimeter lands (e.g., terminals 112) on the package bottom provide electrical connections to the socket 150 or the PCB. Flat no-lead packages can include an exposed thermally conductive pad to improve heat transfer out of the DUT 110 (e.g., into the PCB). The QFN package can be similar to the quad-flat package (QFP). In an embodiment, the DUT 110 can be wafer-level chip scale package (WL-CSP), leaded package such as thin small outline package (TSOP) or diode outline (DO) package, or the like.

Figure 2A:
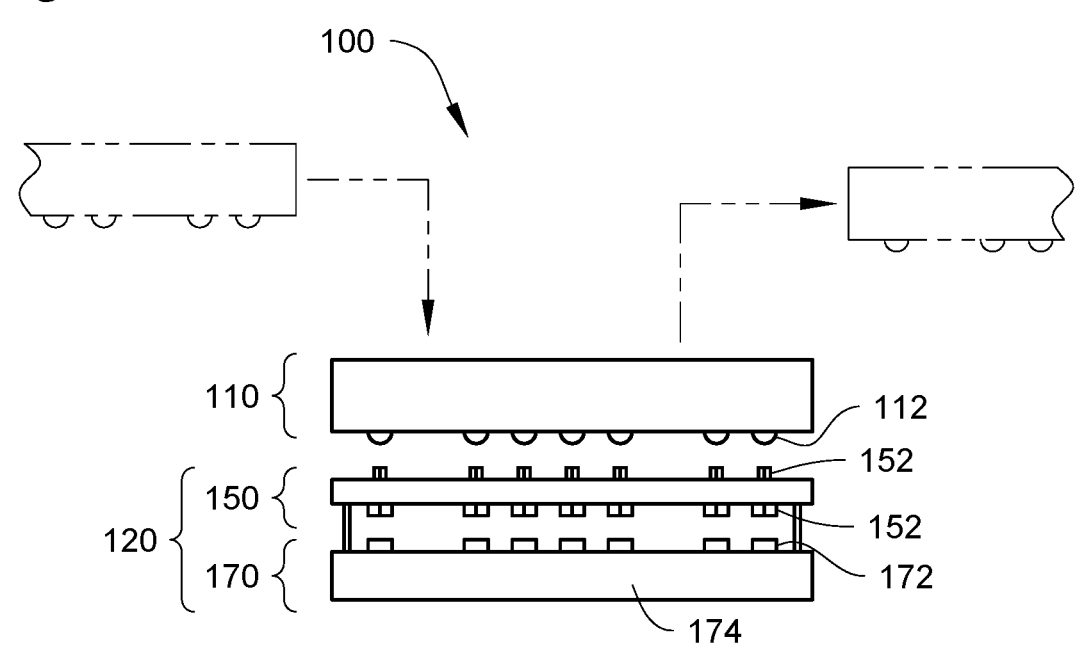
FIG. 2A is a side-view drawing of a portion of the test system for receiving a DUT for Kelvin testing, according to an embodiment.
Figure 2B:
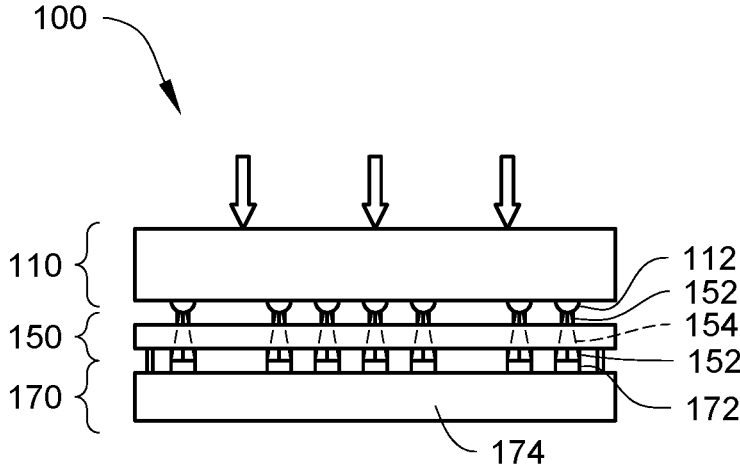
FIG. 2B is a side-view drawing of the test system of FIG. 2A, with the DUT electrically engaged, according to an embodiment.

FIG. 2A is a side-view drawing of a portion of the test system 100 for receiving the DUT 110 for Kelvin testing, according to an embodiment. FIG. 2B is a side-view drawing of the test system 100 of FIG. 2A, with the DUT 110 electrically engaged, according to an embodiment. In Kelvin testing, there are two pads/terminals on the load board 170 connected to each terminal on the DUT 110.

As shown in FIG. 2A, the DUT 110 is placed onto the test assembly 120, electrical testing is performed, and the DUT 110 is then removed from the test assembly 120. Any electrical connections are made by pressing components into electrical contact with other components; there is no soldering or de-soldering at any point in the testing of the DUT 110. The entire electrical test procedure may only last about a fraction of a second, so that rapid, accurate placement of the DUT 110 becomes important for ensuring that the test system 100 is used efficiently. The high throughput of the test assembly 120 usually requires robotic handling of the DUT 110. In most cases, an automated mechanical system places the DUT 110 onto the test assembly 120 prior to testing, and removes the DUT 110 once testing has been completed. The handling and placement mechanism may use mechanical and optical sensors to monitor the position of the DUT 110, and a combination of translation and rotation actuators to align and place the DUT 110 on or in the test assembly 120. Alternatively, the DUT 110 may be placed by hand, or placed by a combination of hand-fed and automated equipment.

The DUT 110 typically includes signal and power terminals 112 (see also terminals 112 of FIG. 1B) that connect to the socket 150 or other PCBs. The terminals may be on one side of the DUT 100, or may be on both sides of the DUT 110. For use in the test assembly 120, all the terminals 112 should be accessible from one side of the DUT 110, although it will be understood that there may be one or more elements on the opposite side of the DUT 110, or that there may be other elements and/or terminals on the opposite side that may not be tested by accessing terminals 112. Each terminal 112 is formed as a small, pad on button side of the DUT 110 or possibly a lead (e.g., half-ball shaped) protruding from the body of the DUT 110. Prior to testing, the pad or lead 112 is attached to an electrical lead that connects internally to other leads, to other electrical components, and/or to one or more chips in the DUT. The volume and size of the pads or leads may be controlled quite precisely, and there is typically not much difficulty caused by pad-to-pad or lead-to-lead size variations or placement variations. During testing, the terminals 112 remain solid, and there is no melting or re-flowing of any solder.

The terminals 112 may be laid out in any suitable pattern on the surface of the DUT 110. In some cases, the terminals 112 may be in a generally square grid, which is the origin of an expression that describes the DUT 110, BGA, WL-CSP, QFN, DFN, TSOP, or DO for leaded parts. There may also be deviations away from a rectangular grid, including irregular spacing and geometries. It will be understood that the specific locations of the terminals may vary as needed, with corresponding locations of pads on the load board 170 and contacts on the socket 150 or housing being chosen to match those of the terminals 112. In general, the spacing between adjacent terminals 112 is in the range of 0.25 to 1.5 mm, with the spacing being commonly referred to as a "pitch". When viewed from the side, as in FIG. 2A, the DUT 110 displays a line of terminals 112, which may optionally include gaps and irregular spacing. These terminals 112 are made to be generally planar, or as planar as possible with typical manufacturing processes. In many cases, if there are chips or other elements on the DUT 110, the protrusion of the chips is usually less than the protrusion of the terminals 112 away from the DUT 110.

The test assembly 120 of FIG. 2A includes a load board 170. The load board 170 includes a load board substrate 174 and circuitry that is used to test electrically the DUT 110. Such circuitry may include driving electronics that can produce one or more AC voltages having one or more particular frequencies, and detection electronics that can sense the response of the DUT 110 to such driving voltages. The sensing may include detection of a current and/or voltage at one or more frequencies. In general, it is highly desirable that the features on the load board 170, when mounted, are aligned with corresponding features on the DUT 110. Typically, both the DUT 110 and the load board 170 are mechanically aligned to one or more locating features on the test assembly 120. The load board 170 may include one or more mechanical locating features, such as fiducials or precisely-located holes and/or edges, which ensure that the load board 170 may be precisely seated on the test assembly 120. These locating features typically ensure a lateral alignment (X, Y, see FIG. 1A) of the load board 170, and/or a longitudinal alignment (Z, see FIG. 1A) as well.

In general, the load board 170 may be a relatively complex and expensive component. The housing/test assembly 120 performs many functions including protecting the contact pads 172 of the load board 170 from wear and damage. Such an additional element may be an interposer socket 150. The socket 150 also mechanically aligns with the load board 170 with suitable locating features (not shown), and resides in the test assembly 120 above the load board 170, facing the DUT 110. The socket 150 includes a series of electrically conductive contacts 152, which extend longitudinally outward on either side of the socket 150. Each contact 152 may include a resilient element, such as a spring or an elastomer material, and is capable of conducting an electrical current to/from the load board 170 from/to the DUT 110 with sufficiently low resistance or impedance. Each contact 152 may be a single conductive unit, or may alternatively be formed as a combination of conductive elements. In Kelvin testing, each contact 152 connects one pair of contact pad 172 on the load board 170 to one terminal 112 on the DUT 110, although there may be testing schemes in which one or multiple contact pads 172 connect to a single terminal 112, or multiple terminals 112 connect to a single contact pad 172. For Kelvin testing, we assume in the text and drawings that a single contact 152 connects a pair of pad 172 to a single terminal 112, although it will be understood that any of the tester elements disclosed herein may be used to connect one or multiple contact pads 172 connect to a single terminal 112, or multiple terminals 112 to a single contact pad 172. Note that in Kelvin testing, there is a pair of contact pads 172 for every terminal 112, with one in the pair for current, and the other for voltage. There is also a pair of contacts 152 for every terminal 112 and every pair of contact pads 172, with each contact electrically connecting a contact pad 172 to the corresponding terminal 112. Note that the two contacts in each pair are generally electrically insulated from each other, and form electrical connections 154 between the terminal 112 and the contact pad 172.

Typically, the socket 150 electrically connects the load board pads 172 and the bottom contact surface of the DUT 110. Although the socket 150 may be removed and replaced relatively easily, compared with removal and replacement of the load board 170, we consider the socket 150 to be part of the test assembly 120 for this document. During operation, the test assembly 120 includes the load board 170, the socket 150, and the mechanical construction that mounts them and holds them in place (not shown). Each DUT 110 is placed against the test assembly 120, is tested electrically, and is removed from the test assembly 120. A single socket 150 may test many DUTs 110 before it wears out, and may typically last for several thousand tests or more before requiring replacement. In general, it is desirable that replacement of the socket 150 be relatively fast and simple, so that the test assembly 120 experiences only a small amount of down time for socket replacement. In some cases, the speed of replacement for the socket 150 may even be more important than the actual cost of each socket 150, with an increase in tester up-time resulting in a suitable cost savings during operation.

FIG. 2A shows the relationship between the test assembly 120 and the DUTs 110. When each DUT 110 is tested, it is placed into a suitable robotic handler with sufficiently accurate placement characteristics, so that a particular terminal 112 on the DUT 110 may be accurately and reliably placed (in X, Y and Z, see FIG. 1A) with respect to corresponding contacts 152 on the socket 150 and corresponding pair of contact pads 172 on the load board 170. The robotic handler (not shown) forces each DUT 110 into contact with the test assembly 120. The magnitude of the force depends on the exact configuration of the test, including the number of terminals 112 being tested, the force to be used for each terminal, typical manufacturing and alignment tolerances, and so forth. In general, the force is applied by the mechanical handler of the tester (not shown), acting on the DUT 110. In general, the force is generally longitudinal, and is generally normal of the load board 170.

FIG. 2B shows the test assembly 120 and DUT 110 in contact, with sufficient force being applied to the DUT 110 to engage the contacts 152 and form an electrical connection 154 between each terminal 112 and its corresponding pair of contact pads 172 on the load board 170. As stated above, there may alternatively be testing schemes in which multiple terminals 112 connect to a single contact pad 172, or multiple contact pads 172 connect to a single terminal 112, but for Kelvin testing in the drawings we assume that a single terminal 112 connects uniquely to a pair of contact pads 172.

Figure 3:
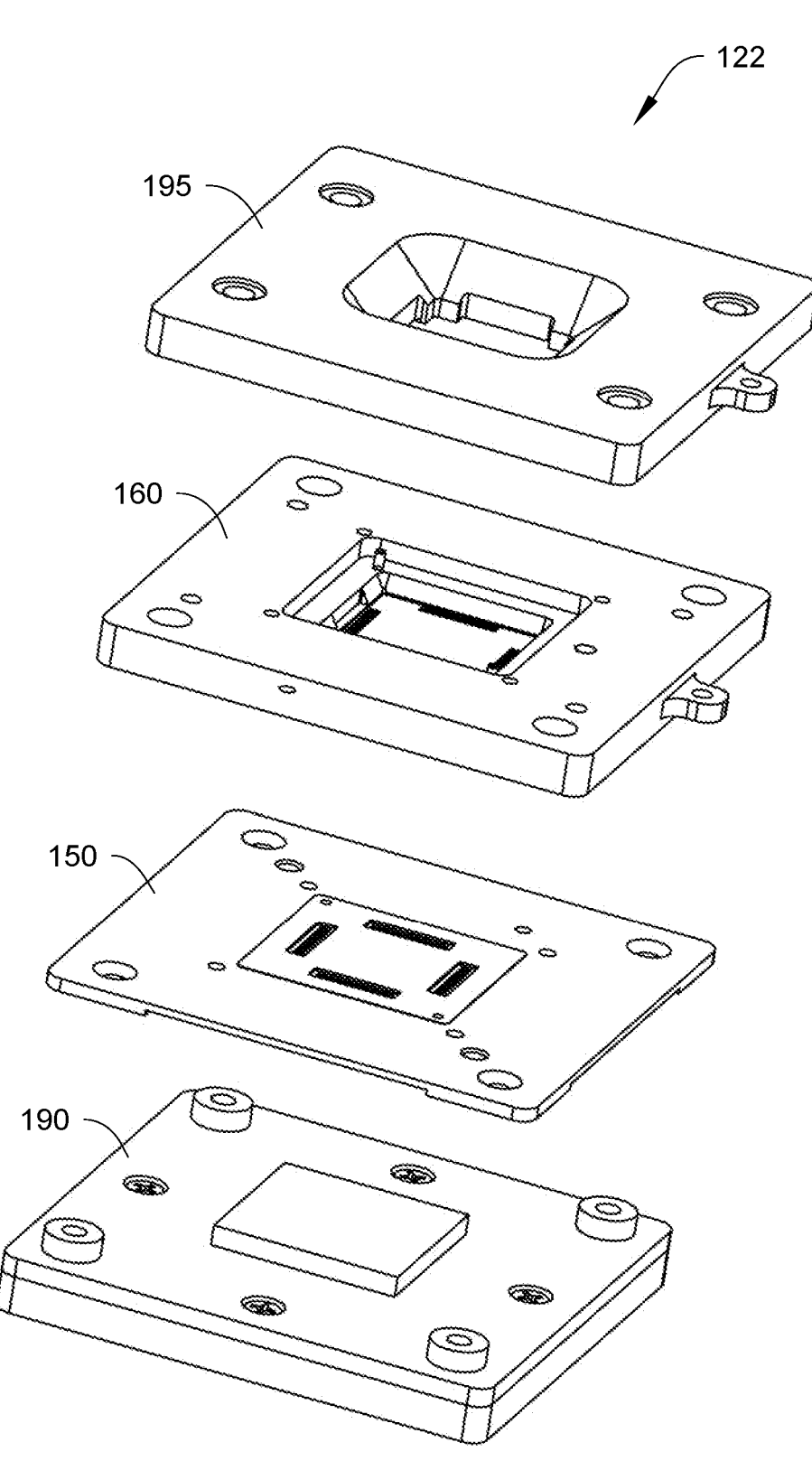
FIG. 3 is an exploded view of building blocks of a test contactor of a test assembly for the testing of a DUT, according to an embodiment.

FIG. 3 is an exploded view of the building blocks of a test contactor 122 of a test assembly 120 for the testing of a DUT, according to an embodiment. It will be appreciated that the connection assembly such as fasteners and/or parts that mount and manipulate the various building blocks of the testing assembly are not shown.

The test contactor 122 includes an optional stiffener 190, a socket 150, an alignment plate 160, and an optional clamping plate 195. The stiffener 190 can provide structural support to a load board (not shown also as known as daughter board, PCB, etc., see FIGS. 1A-2B) to minimize deflection to ensure socket 150 contacting with the load board. The load board is used to route signals from the DUT (via the socket 150) to a tester (not shown) or vice versa. The tester is used to test the DUT (e.g., by sending commands/inputs to the DUT and/or by receiving data/outputs from the DUT). The load board is mounted to a test head in the tester. In the test assembly 120, the load board is disposed between the stiffener 190 and the socket 150.

The socket 150 is used to provide a pathway for inputs/outputs of the DUT to the tester (via the load board). The device alignment plate 160 is to align the DUT to the socket 150. The alignment plate 160 is aligned and is attached to the stiffener 190 by e.g., fasteners that go through holes of the socket 150 and the load board. The alignment plate 160 has a recess/opening (e.g., in the middle of the alignment plate 150) with alignment features and a holder (e.g., Z direction up-stop) to hold the DUT and align the DUT to the socket 150 (so that the S&P pins/pads/leads/balls/lines/terminals of the DUT are aligned with the S&P pins/pads/leads/balls/lines/terminals of the socket 150).

The clamping plate 195 can be optional. The clamping plate 195 can hold the DUT firmly against the load board (via the alignment plate 160 and the socket 150) during testing. In one embodiment, vacuum (instead of the clamping plate 195) can be used as a hold down mechanism for the DUT. In another embodiment, the alignment of the DUT (by the alignment plate 160) can be made as flush as possible, and the DUT can be held at the corners rather than using a clamping plate.

Figure 4:
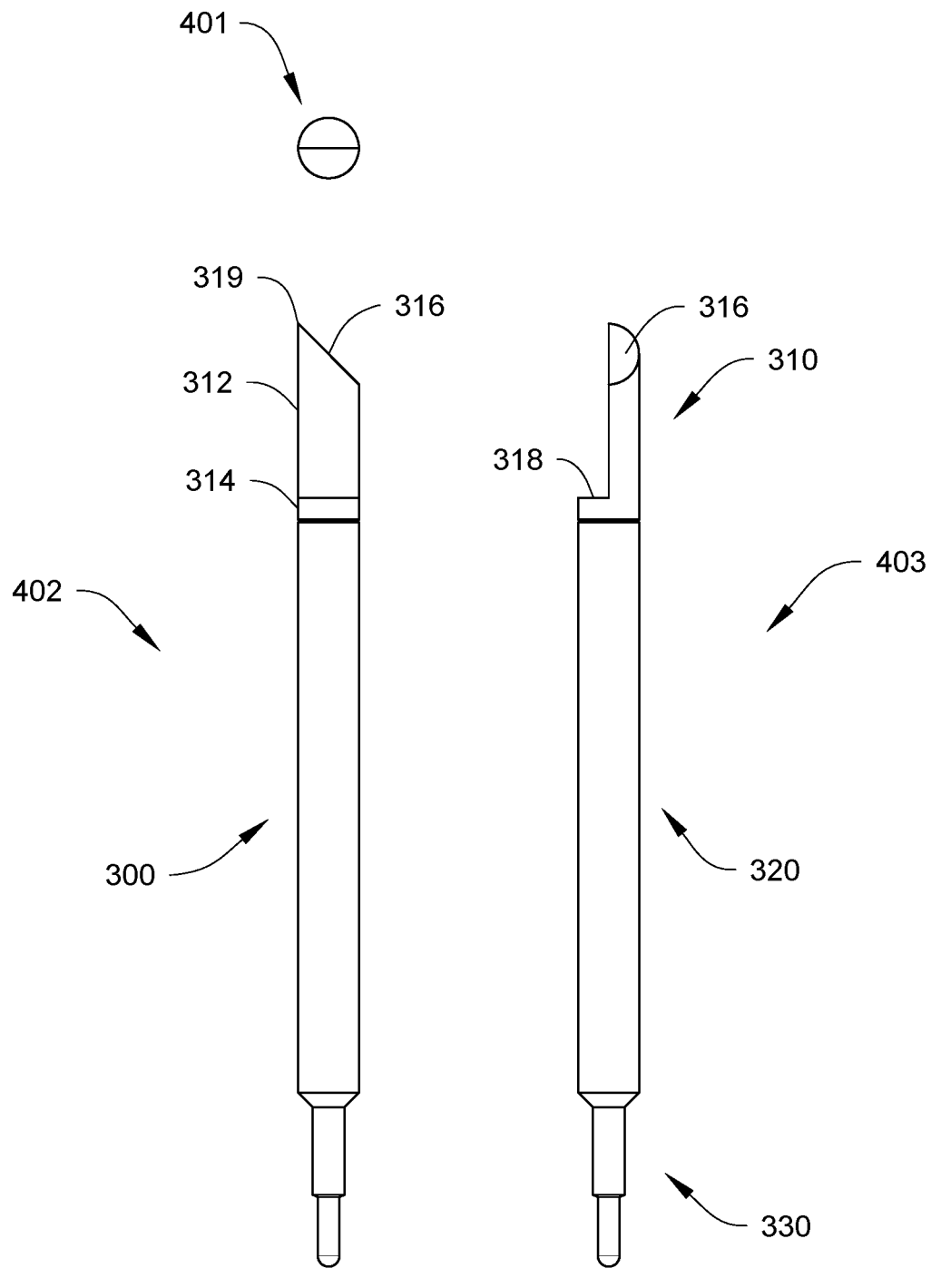
FIG. 4 illustrates side views and an end view of a spring probe, according to some embodiments.
Figure 5:
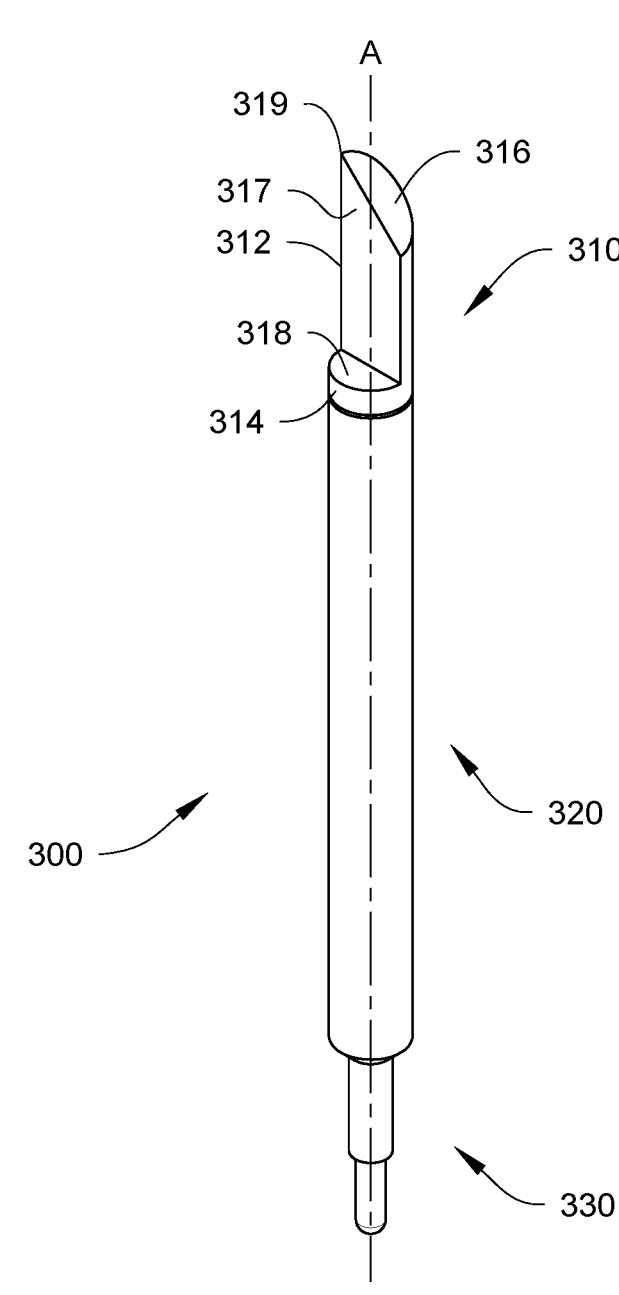
FIG. 5 is a perspective view of the spring probe of FIG. 4, according to an embodiment.

FIG. 4 illustrates side views (402, 403) and an end view (401) of a spring probe 300, according to some embodiments. FIG. 5 is a perspective view of the spring probe 300 of FIG. 4, according to an embodiment.

It will be appreciated that as defined herein, the phrase "spring probe" may refer to a spring-loaded probe or pin which can be a type of electrical connector mechanism that is used in electronic applications and in the electronics testing industry (e.g., used to test semiconductor or printed circuit board used in electric appliances or electronic devices, etc.). A spring probe can be used for its improved durability over other electrical contacts, and the resilience of its electrical connection to mechanical shock and vibration.

As shown in FIGS. 4 and 5, the spring probe 300 includes a head 310, a body 320, and a bottom 330. In an embodiment, the head 310 can be a solid head made of e.g., a homogenous precious metal alloy (including a silver-copper-palladium alloy, palladium alloys, etc.), beryllium copper, brass, steel, or the like or hollow. The head 310 is configured to contact the terminal(s) of the DUT. The terminals (or S&P pins, pads, leads, balls, lines, or the like) of the DUT may be pads, balls, wires (leads) or other contact points. In an embodiment, the head 310 can be referred to as a DUT "plunger". In an embodiment, the head 310 can be plated with Au, Au alloy, Rh, or the like.

In an embodiment, the body 320 can be a hollow body that has a cylindrical shape. The body 320 may contain at least one resilient element (e.g., a spring or the like, not shown) inside the hollow body. In an embodiment, the spring can be e.g., stainless steel spring or the like. In an embodiment, the body 320 can also be referred to as a "barrel". In an embodiment, the body 320 can be made of copper, alloy, or the like. The body 320 can be plated with Au or the like.

In an embodiment, the bottom 330 is moveable by, e.g., compress force(s) from the spring contained inside the body 320, toward the load board; and/or by e.g., forces or pressure from the load board, toward the DUT (e.g., moving towards and/or into and/or inside the body 320). In an embodiment, the bottom 330 can be referred to as a moveable PCB "plunger". The movable plunger 330 can be configured to push against the spring during testing. It will be appreciated that the bottom 330 may have a diameter that is smaller than a diameter of the body 320, so that when pressed (e.g., by the forces from the load board, or the like), the bottom 330 can be moveable into the inside of the body 320 and can compress the spring in the body 320. In an embodiment, the bottom 330 can be made of the same material (and/or with the same plating) as the body 320.

The head 310 includes a base 314, and a top 312 that is integrated with the base 314. The top 312 includes a tip 319, a surface 316, and a surface 317. The tip 319 and/or the surface 316 and/or the curved edge (knife edge) of the surface 316 is configured to contact the terminal(s) of the DUT. A shoulder 318 is disposed between the base 314 and the top 312. In an embodiment, the head 310 has a single shoulder. In an embodiment, the shoulder 318 has a half-circle shape. In an embodiment, the base 314 has a cylindrical shape. Other shapes are possible including oval, rectangular, non-circular, etc. Non-circular shapes provide a means to prevent pin rotation.

It will be appreciated that a shape of the top 312 can be defined by (1) cutting or forming a solid cylinder (that has a same diameter as the base 314 in a circular cross-section view) by a plane (that overlaps with the surface 317) containing an axis of symmetry ("A") of the solid cylinder to form a half-cylinder or form a bisected half-cylinder; (2) rotating the plane 90 degrees about the axis of symmetry of the solid cylinder; (3) tilting the plane at an angle with respect to a circular cross-section of the solid cylinder; and (4) cutting the half-cylinder by the plane to form the shape of the top 312. It will be appreciated that the above processes define the shape of the top 312, and that the order and/or the number of steps of the processes may be changed or different, as long as the shape of the top 312 is defined. The shape may also be defined as a half-cylinder with a flat front portion and an angular tip portion. The angular tip portion has a chisel point apex; a curved edge extending from the apex; and a straight edge extending from the apex.

For example, the same shape of the top 312 can also be defined by: (1) tilting a plane (that overlaps with the surface 317) containing an axis of symmetry of a solid cylinder (that has a same diameter as the base 314 in a circular cross-section view) at an angle with respect to a circular cross-section of the solid cylinder; (2) cutting the solid cylinder by the plane to form a cylindrical segment (or truncated cylinder); (3) tilting the plane back to its original location (that overlaps with the surface 317); (4) rotating the plane 90 degrees about the axis of symmetry of the solid cylinder; and (5) cutting the cylindrical segment into half to form the shape of the top 312.

That is, the processes above are configured to define the shape of the top 312, and are not intended to limit the top 312 in any ways (including e.g., how to make the top 312), as long as the shape of the top 312 is defined. The top 312 can be made using any suitable processes. The above processes are not limiting the top 312 in any ways except for defining the shape of the top 312.

In an embodiment, the angle in the above processes ranges from at or about 30 degrees to at or about 60 degrees. In another embodiment, the angle is at or about 45 degrees.

As shown in FIG. 4, the end view 401 of the spring probe 300 is viewed from the tip 319 side, showing the single shoulder 318 (a half-circle shape) and the end view (the other half-circle shape) of the top 312. In an embodiment, the base 314, the solid cylinder that forms the top 312, and the body 320 have a same diameter in a circular cross-section view. In an embodiment, the diameter is at or about 210 microns. In another embodiment, the diameter is at or about 330 microns. In an embodiment, a minimum of the diameter is at or about 200 microns. It will be appreciated that the diameter can be at any suitable size.

The side view 402 is a view that rotates 90 degrees about the axis of symmetry of the base 314, from the side view 403. The surface 316 includes a curved edge (a knife edge) and a straight edge.

Figure 6A:
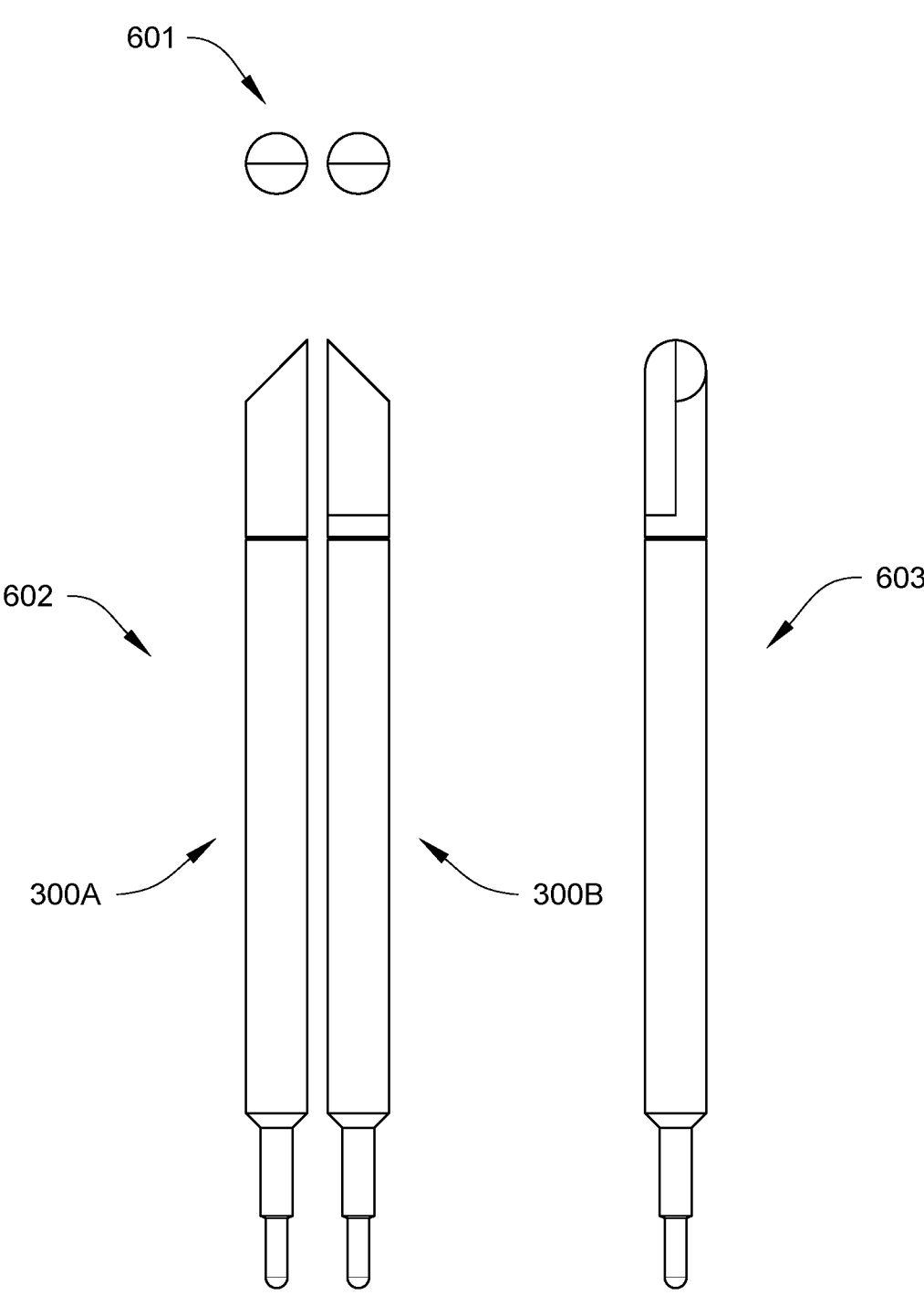
FIG. 6A illustrates side views and an end view of a spring probe assembly, according to some embodiments.
Figure 6B:
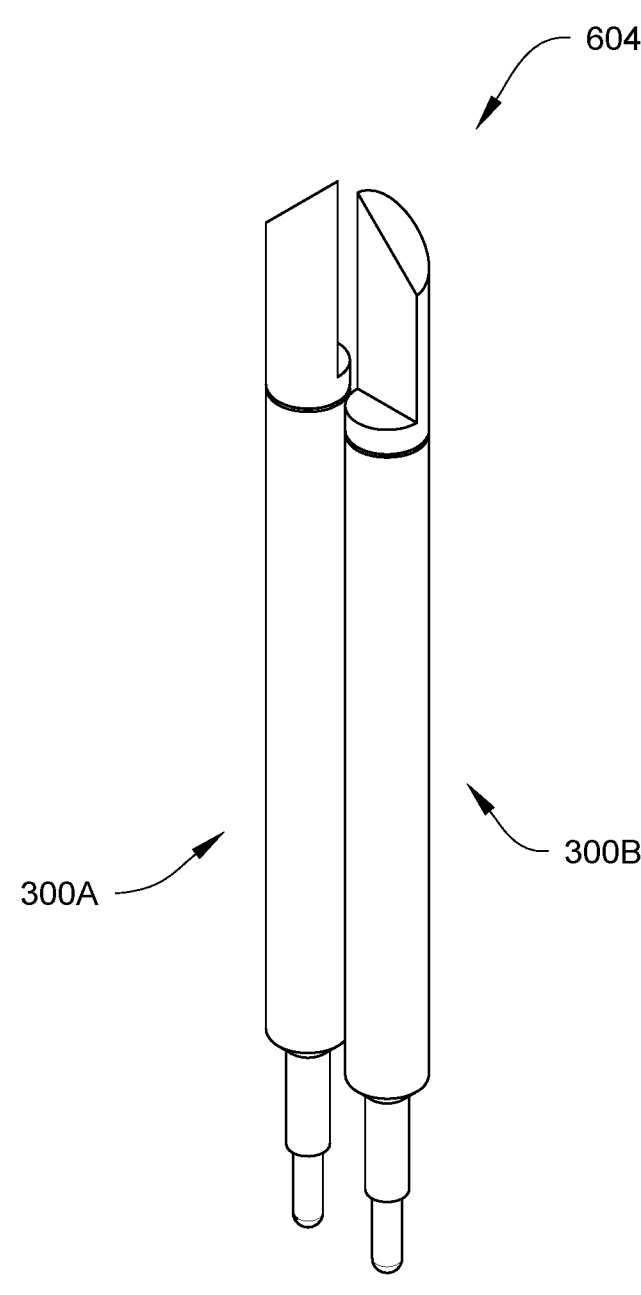
FIG. 6B is a perspective view of the spring probe assembly of FIG. 6A, according to an embodiment.

FIG. 6A illustrates side views (602, 603) and an end view (601) of a spring probe assembly (a spring probe 300A and a spring probe 300B), according to some embodiments. FIG. 6B is a perspective view 604 of the spring probe assembly (300A, 300B) of FIG. 6A, according to an embodiment.

It will be appreciated that the spring probe 300A and the spring probe 300B can be generally preferably identical to each other (e.g., in shape, size, or the like) so that they are interchangeable, but they can differ if desired. One of the spring probes (300A, 300B) can be used as a force spring probe, and the other one of the spring probes (300A, 300B) can be used as a sense spring probe, for a Kelvin testing system for testing integrated circuit devices. As show in FIGS. 6A and 6B, the force spring probe and the sense spring probe can be disposed so that the tips of the force spring probe and the sense spring probe are adjacent to each other and thus share a single DUT contact as closely as possible. That is, during testing, the spring probe 300A is arranged to be rotated 180 degrees with respect to the spring probe 300B. In an embodiment, a distance between the tips of the force spring probe and the sense spring probe is at or about 70 microns. In an embodiment, a minimum distance between the tips of the force spring probe and the sense spring probe is at or about 70 microns. It will be appreciated that the tips 319 are oriented as close as possible to each other with a minimum gap. It will also be appreciated that compared with the minimum gap, the bottoms 330 of the spring probes (300A, 300B) are further apart, which provide more room for a printed circuit board (e.g., the load board) on the load board end.

As shown in FIG. 6A, the end view 601 of the spring probe assembly (300A, 300B) is viewed from the tips 319 side, showing the single shoulders 318 (a half-circle shape) and the end views (the other half-circle shape) of the tops 312 of the spring probe assembly (300A, 300B). The side view 602 is a view that rotates 90 degrees from the side view 603.

It will be appreciated that during testing, the tip(s) 319 of the spring probe assembly (300A, 300B) are contacting the terminal(s) of the DUT, the bottom(s) 330 of the spring probe assembly (300A, 300B) are contacting the pads of the load board, and current/voltage/signal can pass through the conductive spring probe assembly (300A, 300B) from the DUT to the load board or vice versa.

Figure 7:
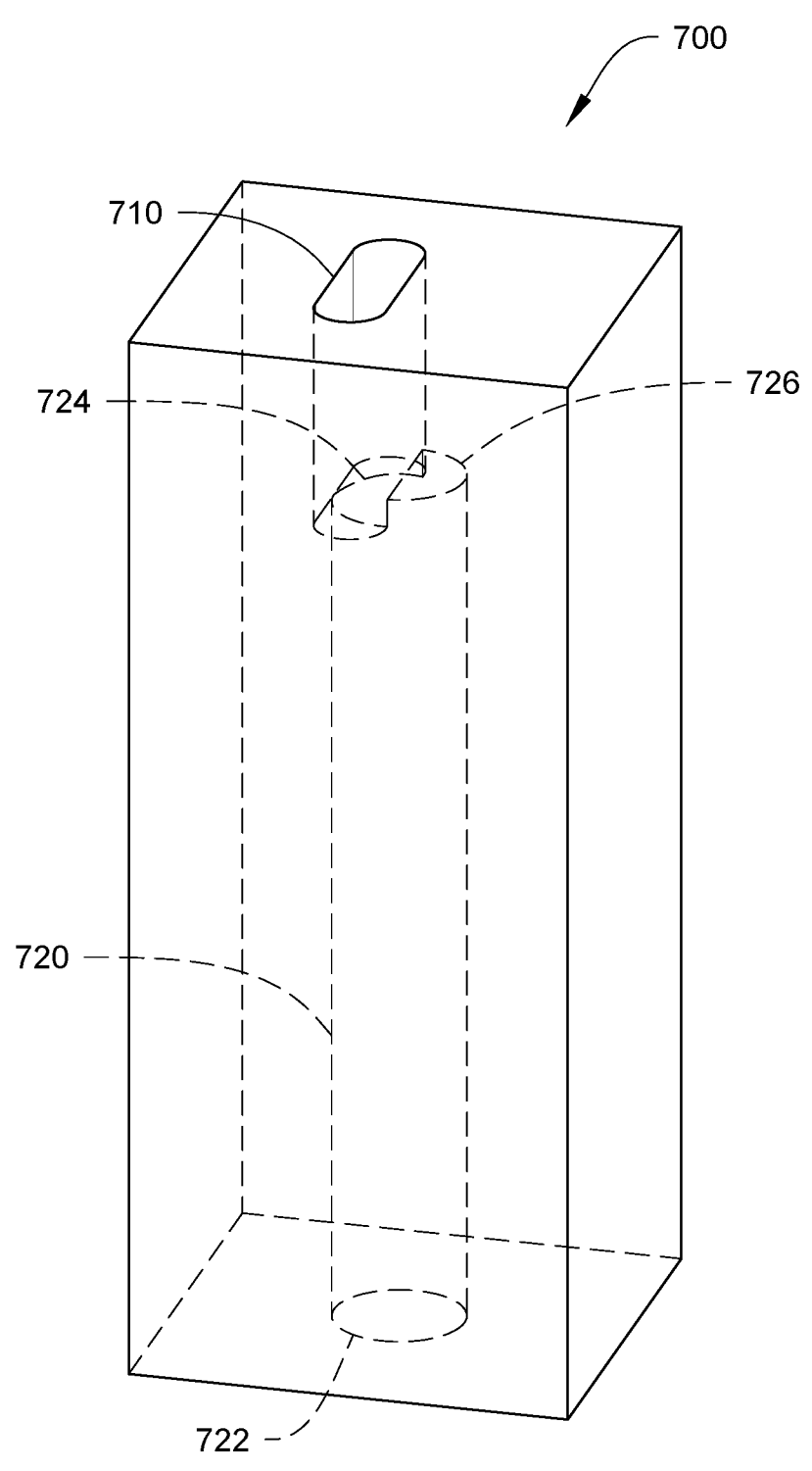
FIG. 7 is a perspective view of a housing for a spring probe, according to an embodiment.
Figure 8A:
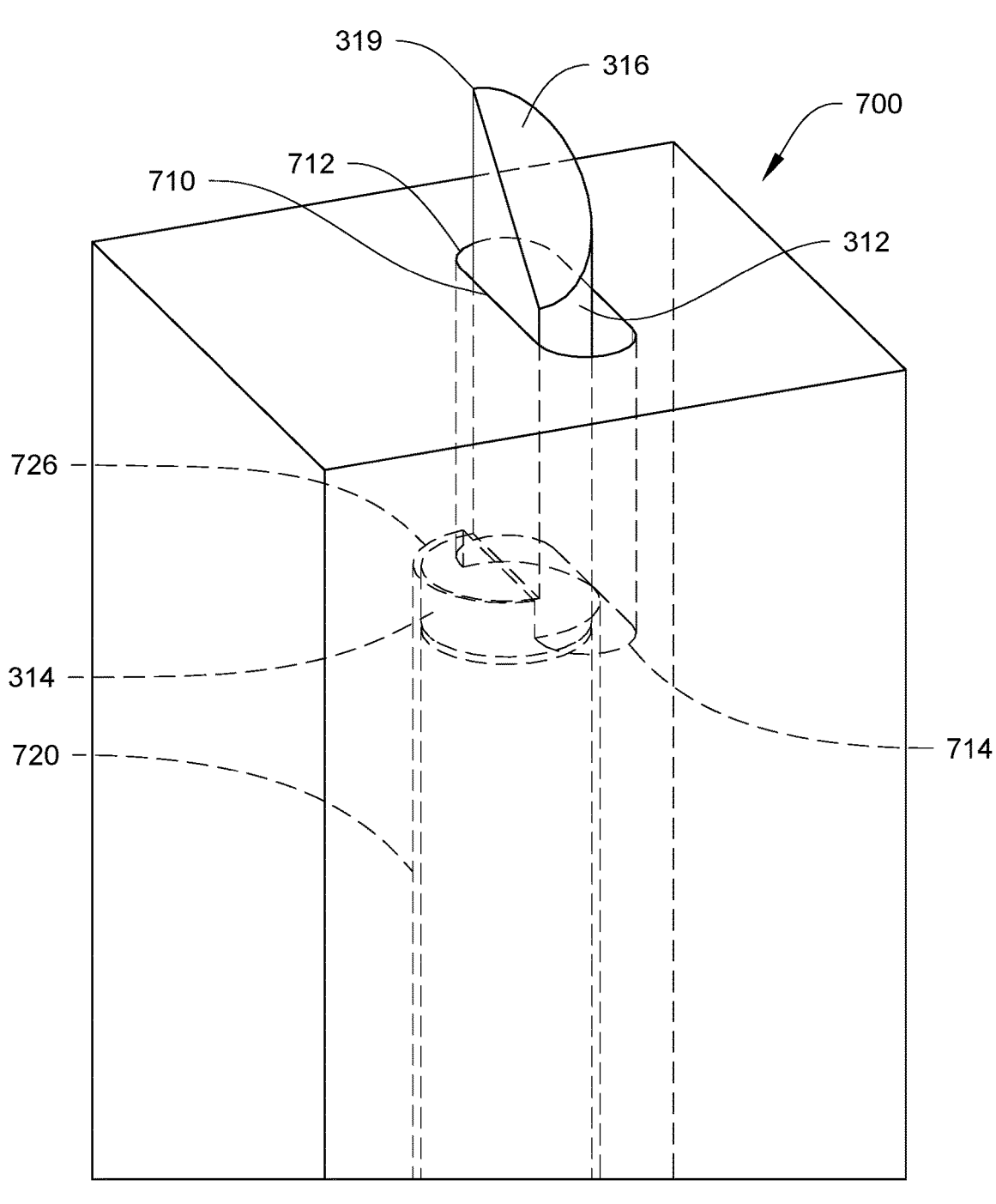
FIG. 8A is a perspective view of a portion of a housing accommodating a spring probe, according to an embodiment.
Figure 8B:
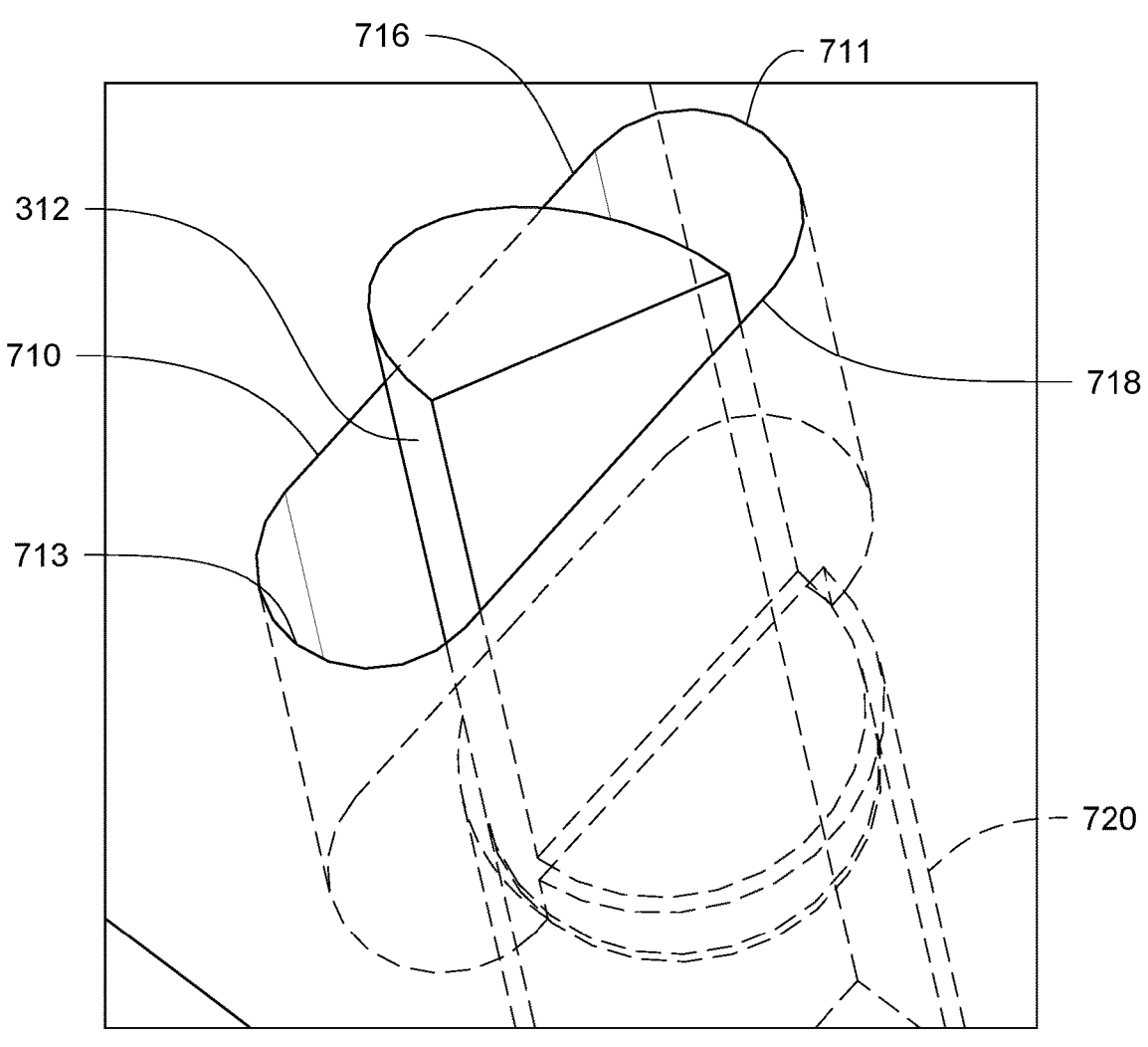
FIG. 8B is a perspective view of a portion of a housing accommodating a spring probe, according to another embodiment.

FIG. 7 is a perspective view of a portion of a housing 700 for a spring probe, according to an embodiment. In a typical configuration, there would be numerous housings 700 side by side or integrated into a single test housing. FIG. 8A is a perspective view of a portion of a housing 700 accommodating a spring probe 300, according to an embodiment. FIG. 8B is a perspective view of a portion of a housing 700 accommodating a spring probe 300, according to another embodiment. It will be appreciated that the housing 700 is typically made of non-conductive material(s) such as plastics, ceramics, metals with an insulative coating, or the like. It will also be appreciated that the housing 700 shown in FIG. 7 has a substantial cuboid shape, but it can be of any suitable shape. It will further be appreciated that the cuboid shape shown is strictly a cut-away, and almost all applications of the housing 700 can have a plurality of identical cavities.

The housing 700 can be made of a solid housing material and can include a slot 710 and a hole/bore 720. The slot 710 has two ends (upper and lower) (712, 714) each having a substantially stadium shape (i.e., a rectangle with semi-circles at a pair of opposite sides). The slot is sized to receive top portion 312 without impingement, but sufficient to prevent substantial rotation of this semicircular portion of the pin. The slot 710 extends from the end 712 to the end 714 and partially overlaps with the hole 720 at 724. The central axis of slot 710 is therefore offset from the central axis of bore 720. It will be appreciated that the slot 710 can have any suitable shape. The hole 720 is a substantial cylindrical shape, extends from a bottom opening 722 towards the slot 710, and overlaps with the slot 710 in a shape of half of the base 314 (that is integrated with the top 312) of the spring probe 300. In another embodiment, the slot 710 does not overlap with the hole 720 but only intersects the hole 720 at 724.

In an embodiment, the diameter (of a circular cross-section) of the hole 720 is the diameter (of a circular cross-section) of the body 320 of the spring probe 300 plus a predetermined clearance. The clearance can be, e.g., maximum of at or about 5% to at or about 10% of the diameter (of a circular cross-section) of the body 320 of the spring probe 300, to allow for manufacturing tolerance, to guarantee that there is no interference/binding between the spring probe 300 and the hole 720, (the clearance being as tight as possible) to prevent binding the material of the spring probe 300 with the hole 720, and to allow movement of the spring probe 300 inside the hole 720. The hole 720 has a top end 726. The end 726 is configured as an up-stop, by virtue of the offset of the slot 710 and bore 720, to prevent the shoulder 318 of the spring probe 300 from moving further upwards (towards the DUT side).

As shown in FIG. 8A, the spring probe 300 is in an uncompressed state. That is, the spring of the spring probe 300 is neither compressed by the forces from the terminals of the DUT, nor by the forces from the pads of the load board. In such uncompressed state, the tip 319 and/or the surface 316 of the spring probe 300 is disposed outside of (i.e., passing through) slot 710, while the shoulder 318 of the spring probe 300 can be stopped by the up-stop 726 of the hole 720.

When the spring probe 300 is in a compressed state, the spring of the spring probe 300 is compressed by the forces from the terminals of the DUT and/or by the forces from the pads of the load board. In such compressed state, portions of the surface 316 of the spring probe 300 might be disposed inside of the slot 710, while the shoulder 318 of the spring probe 300 can be stopped by the up-stop 726 of the hole 720 (due to e.g., forces from the pads of the load board). In such compressed state, the bottom 330 of the spring probe 300 might move upwards (i.e., towards the body 320) to compress the spring of the spring probe 300.

The slot has two sides/edges (716, 718). The side 716 is tangent to hole 710. A distance between the sides (716, 718) can be a radius (of a half-circular cross-section) of the top 312 plus a predetermined clearance. The clearance can be, e.g., maximum of at or about 5% to at or about 10% of the radius, to allow for manufacturing tolerance, to guarantee that there is no interference between the head 310 of the spring probe 300 and the slot 710, (the clearance being as tight as possible) to prevent binding the material of the s head 310 with the slot 710, and to allow movement of the head 310 inside the slot 710. That is, the distance between the sides (716, 718) can be roughly half a radius of the hole 720. In an embodiment, a distance between the tips (711, 713) of the end 712 of the slot 710 can be slightly larger than a diameter (of a circular cross-section) of the hole 720 due to the mechanical tolerance and the manufacturing processes. It will be appreciated that the size of the hole 720 and the slot 710 are nominally slightly larger than the size of the spring probe 300, so that the spring probe 300 is allowed to freely slide up and down during its compression. It will also be appreciated that the design of the housing 700 can maintain the orientation of the spring probe during testing.

Figure 9:
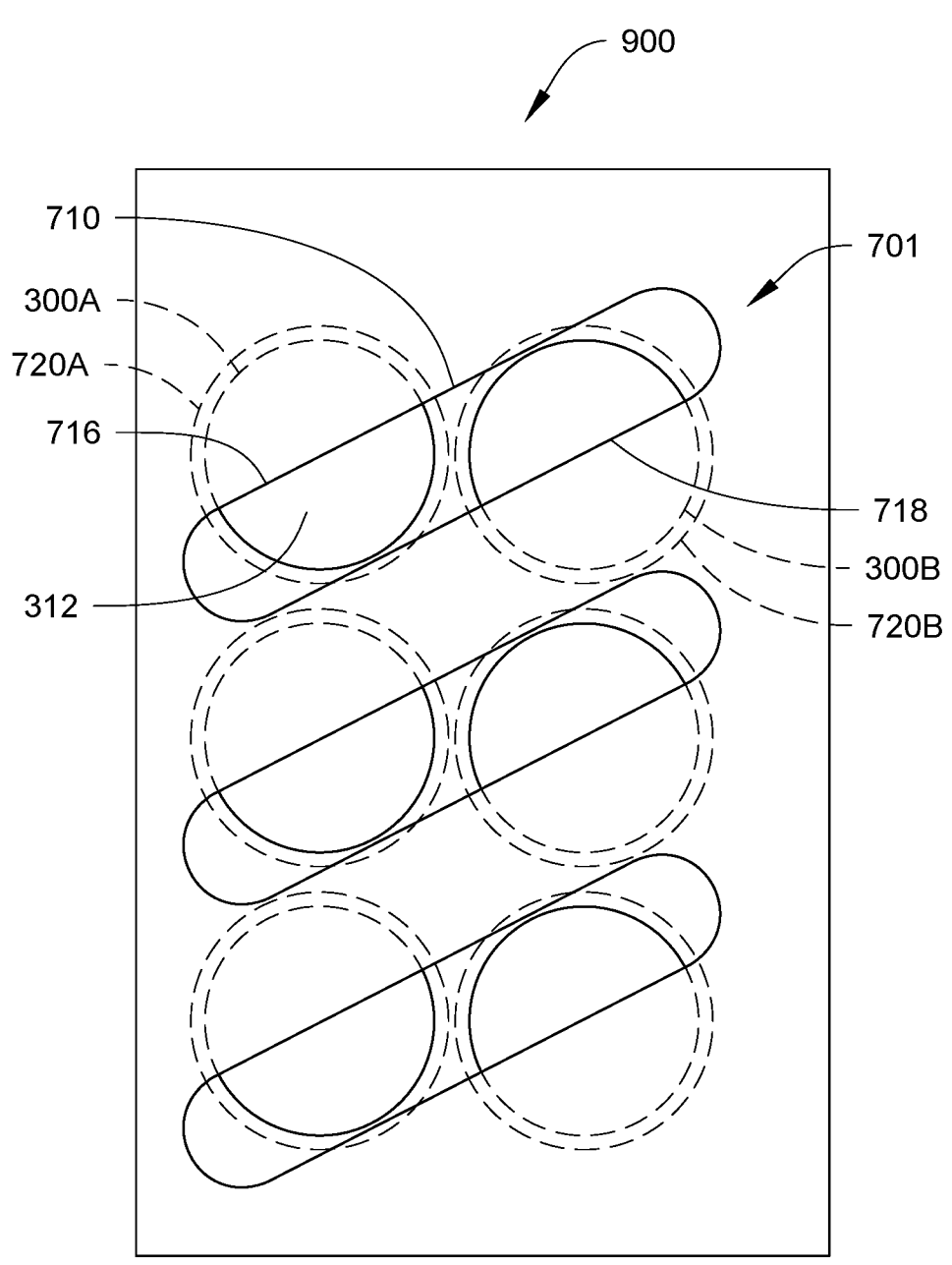
FIG. 9 is a top view of spring assemblies accommodated in housings, according to an embodiment.

FIG. 9 is a top view 900 of spring assemblies (300A, 300B) accommodated in housings 701, according to an embodiment. FIG. 9 shows that one spring assembly (300A, 300B) is accommodated in one housing 701. It will be appreciated that each spring probe of the spring assembly (300A, 300B) can be accommodated in one housing 700 (see FIGS. 8A and 8B), and the two housing 700 of the spring assembly (300A, 300B) can be arranged/disposed adjacent to each other. In such embodiment, the housing 700 can include a wall (e.g., at the tip 319 side) having a thickness of preferably at or about 40 microns. It will be appreciated that a minimum thickness of the wall (e.g., at the tip 319 side) can be at or about 10 microns. The side 716 of the slot of the housing 700 is tangent to the hole 720 of the housing 700. Back to FIG. 9, the side 716 of the slot of the housing 701 is tangent to the hole 720B of the housing 701, and the side 718 of the slot of the housing 701 is tangent to the hole 720A of the housing 701. The tangents can result in angled slot (from the horizontal direction) in the housing 701. Slot 710 in FIG. 9 is approximately twice as long as that shown in FIG. 8A, so as to accommodate the protrusion of two side by side spring pins, which are needed to form a kelvin test.

Figure 10A:
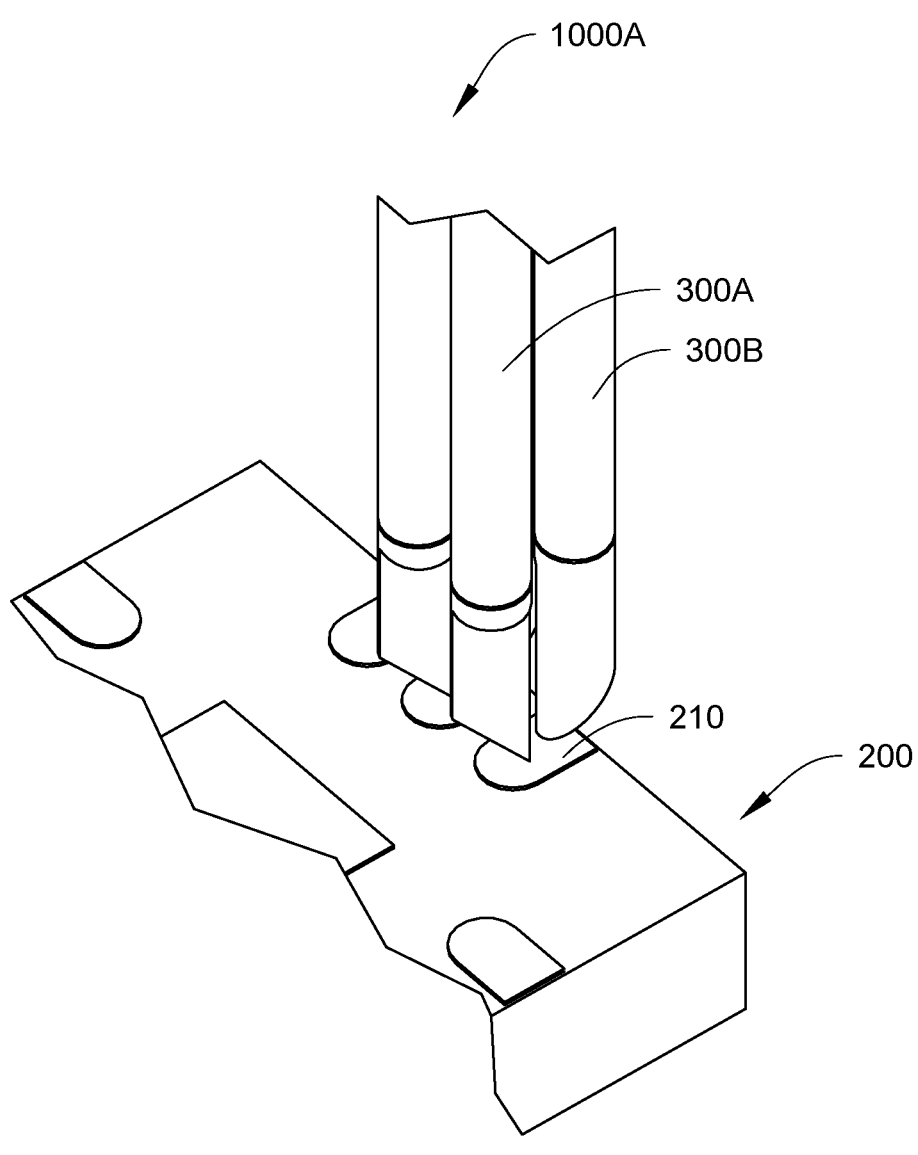
FIG. 10A is a perspective view of spring assemblies contacting terminals of a DUT, without showing the housing, according to an embodiment.
Figure 10B:
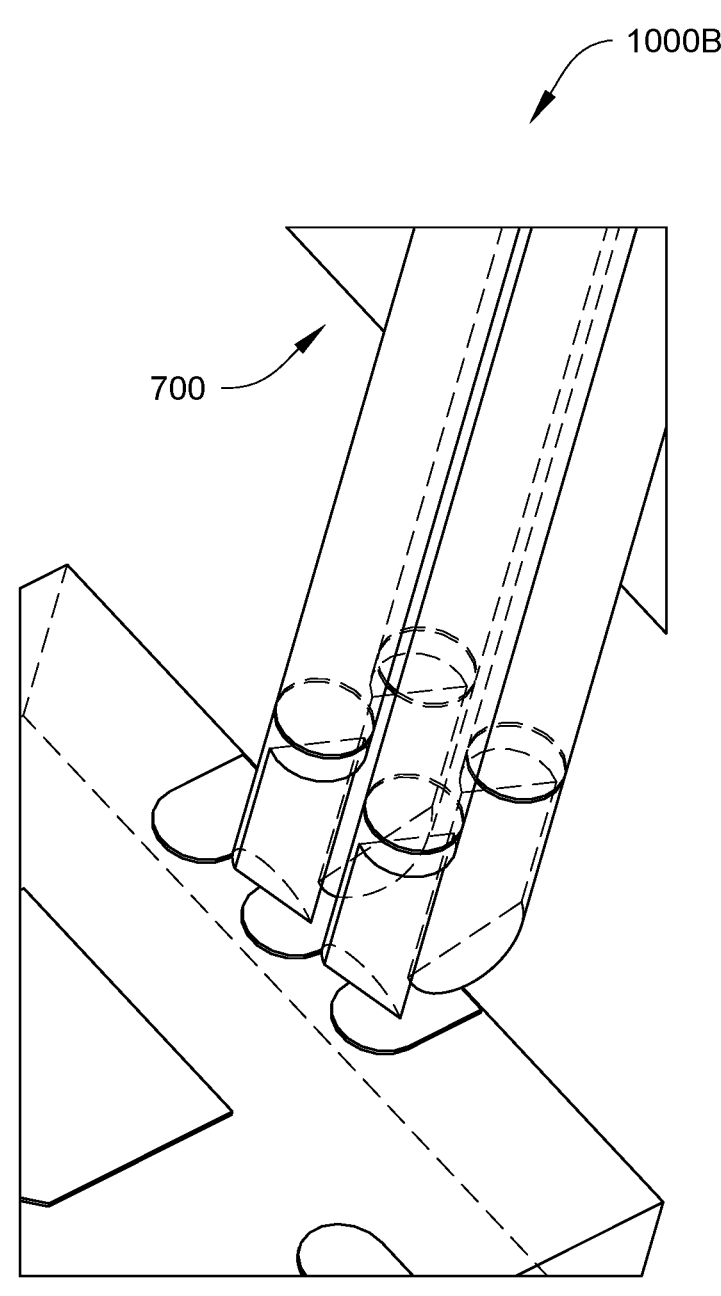
FIG. 10B is a perspective view of spring assemblies accommodated in the housing and contacting terminals of a DUT, according to another embodiment.

FIG. 10A is a perspective view 1000A of spring assemblies (300A, 300B) contacting terminals 210 of a DUT 200, without showing the housing, according to an embodiment. FIG. 10B is a perspective view 1000B of spring assemblies (300A, 300B) accommodated in the housing 700 and contacting terminals 210 of a DUT 200, according to another embodiment. The two tops (tips, knife/curved edges, or the surfaces containing the knife/curved edges) of each spring assembly (300A, 300B) are configured to contact one terminal of the DUT 200. In FIGS. 10A and 10B, the DUT 200 can have flat no-leads packages such as quad-flat no-leads (QFN) and/or dual-flat no-leads (DFN), and the terminals 210 can be flat pads. In other embodiments, the DUT 200 can have any suitable packages.

In an embodiment, the DUT 200 is a 0.35-millimeter pitch device. In another embodiment, the DUT 200 is a 0.3-millimeter pitch device. It will be appreciated that the DUT 200 can be a device having any suitable pitch.

Figure 11A:
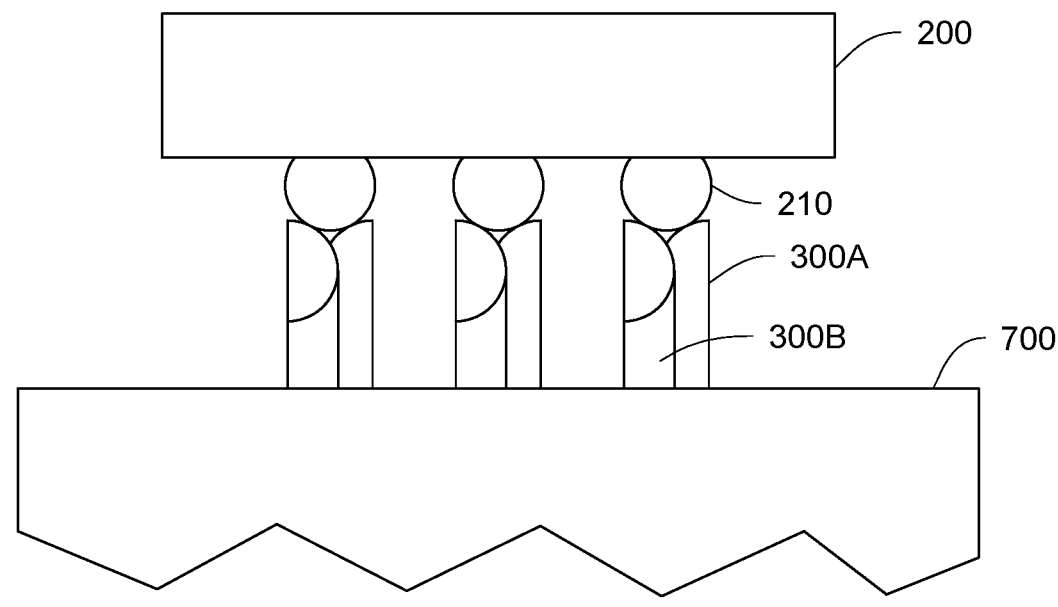
FIG. 11A is a side view of spring assemblies contacting terminals of a DUT, according to an embodiment.
Figure 11B:
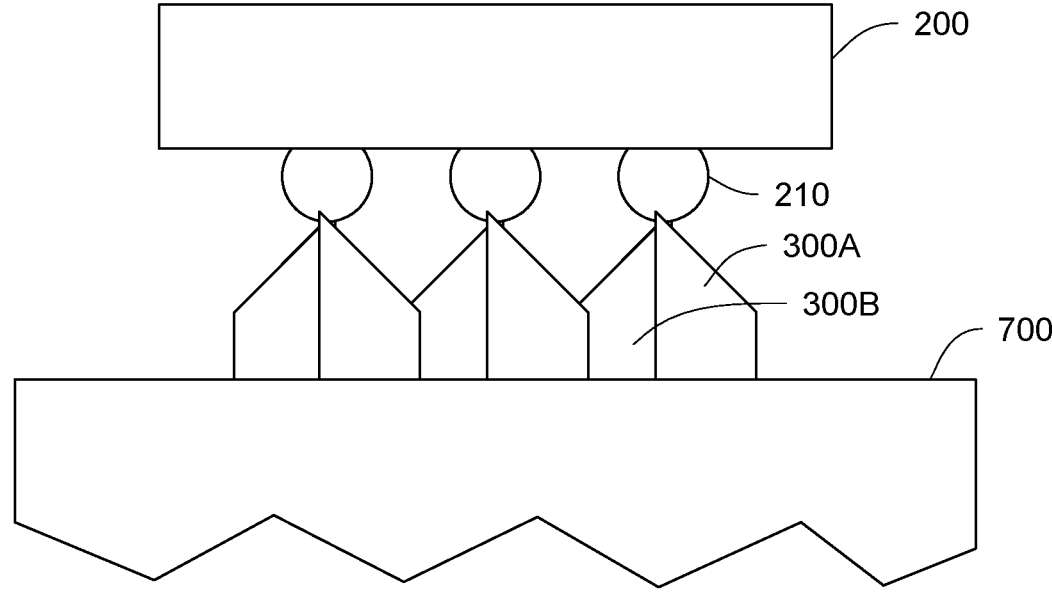
FIG. 11B is a side view of FIG. 11A rotated 90 degrees, according to an embodiment.

FIG. 11A is a side view of spring assemblies (300A, 300B) contacting terminals 210 of a DUT 200, according to an embodiment. FIG. 11B is a side view of FIG. 11A rotated 90 degrees, according to an embodiment. FIG. 11C is a side perspective view of a spring assembly (300A, 300B) contacting a terminal 210 of a DUT 200, according to an embodiment. FIG. 11D is a side perspective view of FIG. 11C rotated 90 degrees, according to an embodiment. FIG. 11E is a top perspective view of FIG. 11C, according to an embodiment.

As shown in FIGS. 11A-11E, the DUT 200 can be a ball grid array (BGA) device with terminals 210 that have a shape of a spherical ball. It will be appreciated that during the testing, the design (e.g., the arrangement of the tips, the minimum gap between the tips, or the like) of the embodiments disclosed herein can make sure that the two tips 319 of the spring probe of the spring assembly (300A, 300B) do not contact the terminal 210 (to make the Kelvin testing effective and to, prevent damage to the terminal(s) 210 due to the sharpness of the tips). Instead, the curved edge (knife edge) of the surface 316 or the surface 316 of each spring probe contacts the terminal 210, to provide e.g., plowing and/or self-cleaning. As shown in FIGS. 11C and 11E, the shaded area shows overlap/engagement/penetration point of the spring probes on the BGA ball/terminal. It will be appreciated that a floating alignment plate can be used to keep components of the testing system together. It will also be appreciated that the tips 319, could be blunt (i.e., not sharp) for certain uses such as flat pads on a DUT.

Figure 12A:
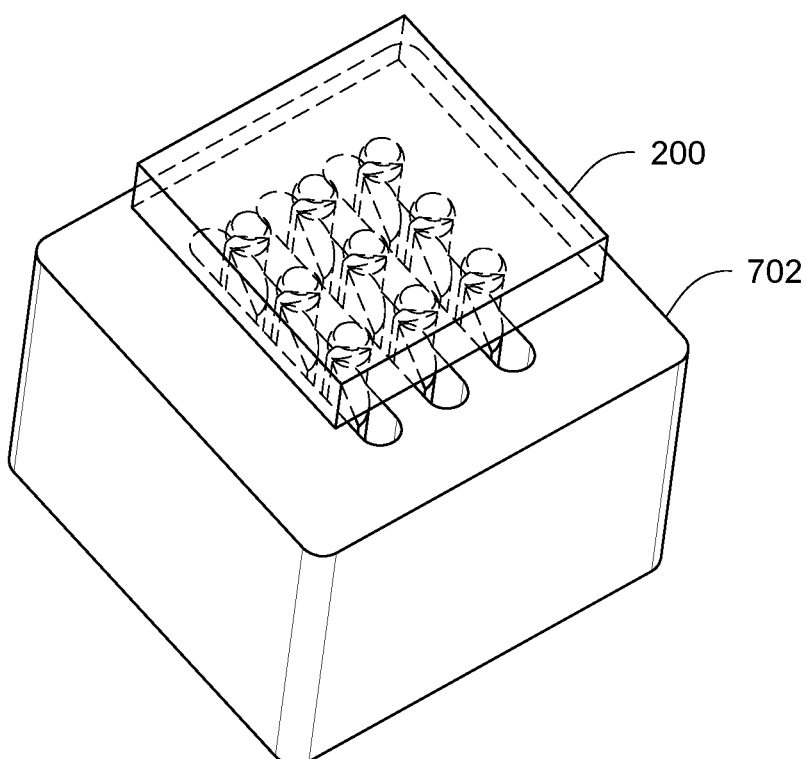
FIG. 12A is a perspective view of spring assemblies accommodated in a housing and contacting terminals of a DUT, according to an embodiment.
Figure 12B:
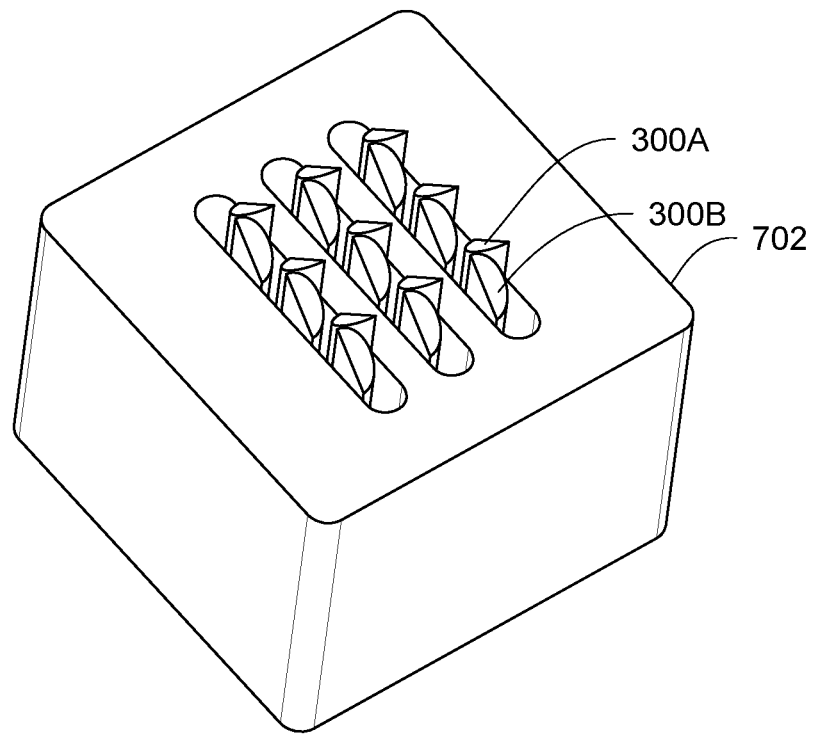
FIG. 12B is FIG. 12A without showing the DUT, according to an embodiment.
Figure 12C:
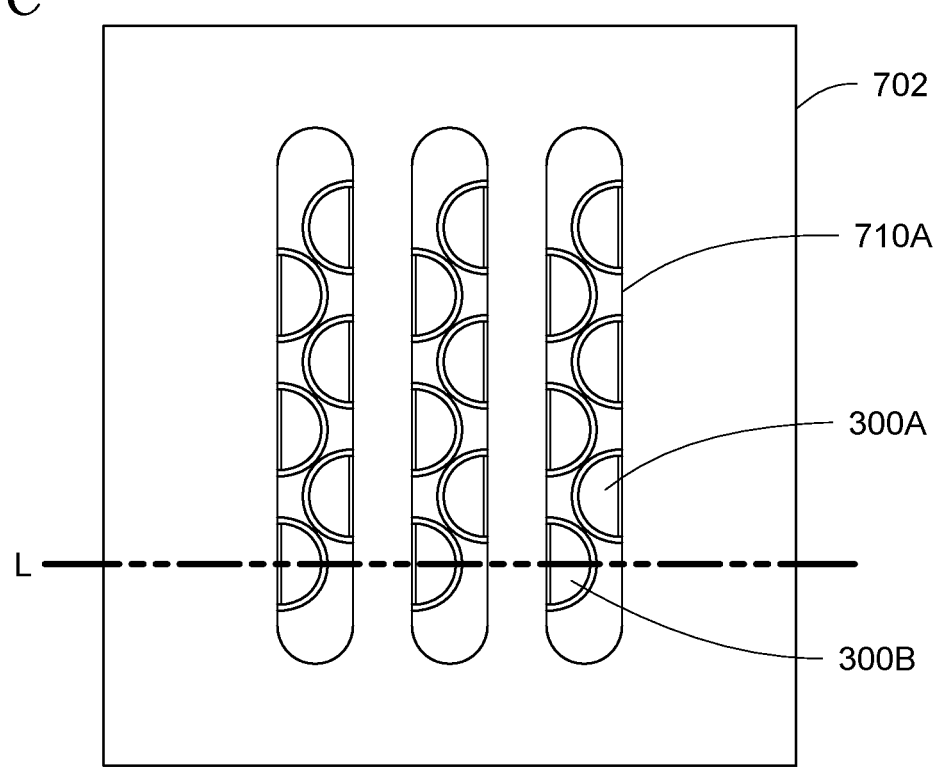
FIG. 12C is a top view of FIG. 12A, according to an embodiment.
Figure 12D:
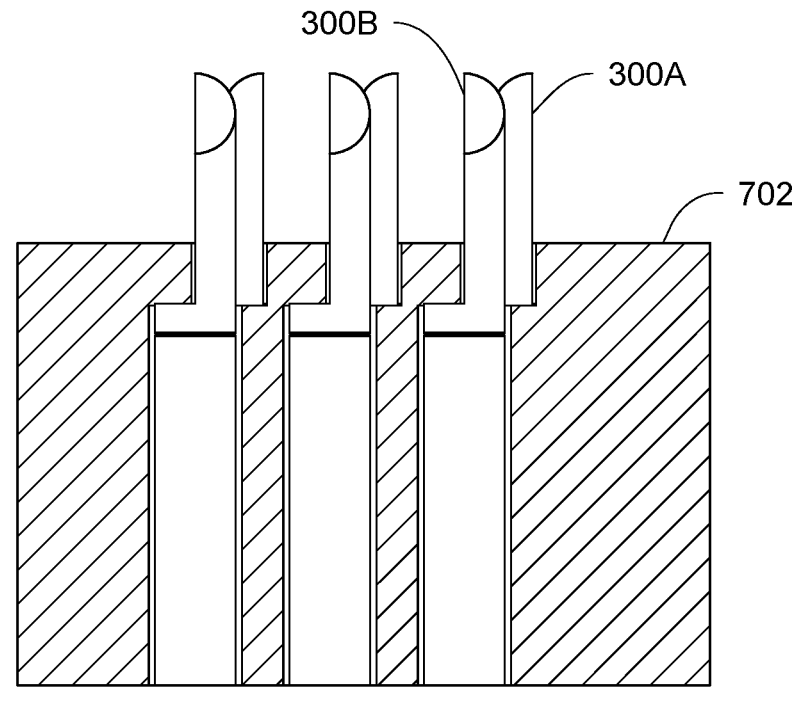
FIG. 12D is a cross sectional side view along the line L of FIG. 12C, according to an embodiment.
Figure 12E:
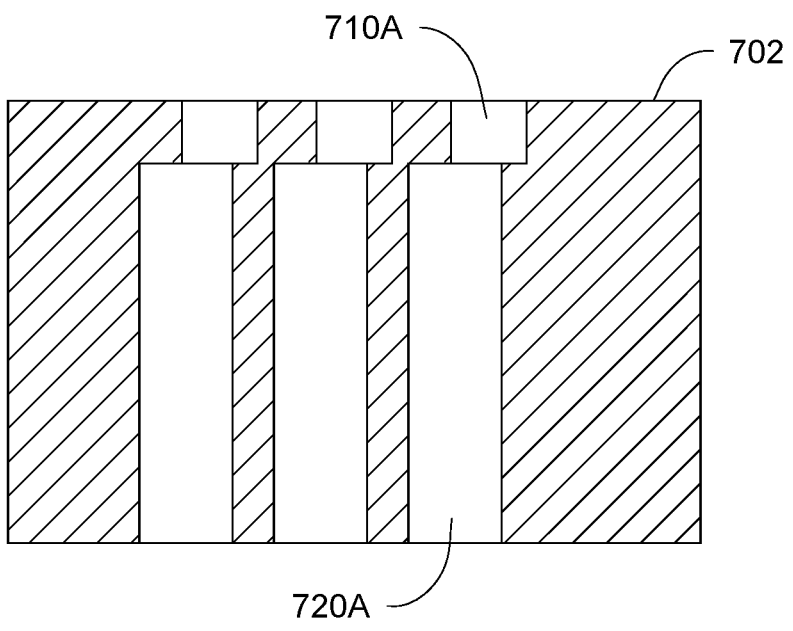
FIG. 12E is FIG. 12D without showing the spring assemblies, according to an embodiment.

FIG. 12A is a perspective view of spring assemblies (300A, 300B) accommodated in a housing 702 and contacting terminals of a DUT 200, according to an embodiment. FIG. 12B is FIG. 12A without showing the DUT, according to an embodiment. FIG. 12C is a top view of FIG. 12A, according to an embodiment. FIG. 12D is a cross sectional side view along the line L of FIG. 12C, according to an embodiment. FIG. 12E is FIG. 12D without showing the spring assemblies, according to an embodiment.

In an embodiment, the housing 702 can be the same as housing (e.g., 700 of FIG. 7, or 701 of FIG. 9) except that a row of spring assemblies (300A, 300B) corresponding to a row of terminals of the DUT 200 shares a slot 710A that extends in a direction along the row. It will be appreciated that the hole 720A can be the same as the hole 720 of FIG. 7, or a row of spring assemblies (300A, 300B) corresponding to a row of terminals of the DUT 200 can share a hole 720A that extends in a direction along the row. For each spring assembly (300A, 300B), the spring probe 300A is orthogonal to the spring probe 300B. As shown in FIG. 12E, the vertical central line of the slot 710A is offset from the vertical central line of the hole 720A.

The housing 702 can be made by milling or boring hole 720A from underside the housing, while slot 710A is milled or bored from the top, therefore allowing for the offset to be selectively determined.

It will be appreciated that the slot 710A need to be wide enough to accommodate the row of the spring assemblies (300A, 300B).

It will be appreciated that the shared slot 710A can allow for e.g., extremely dense packing of pins in a socket of the testing system.

Figure 13:
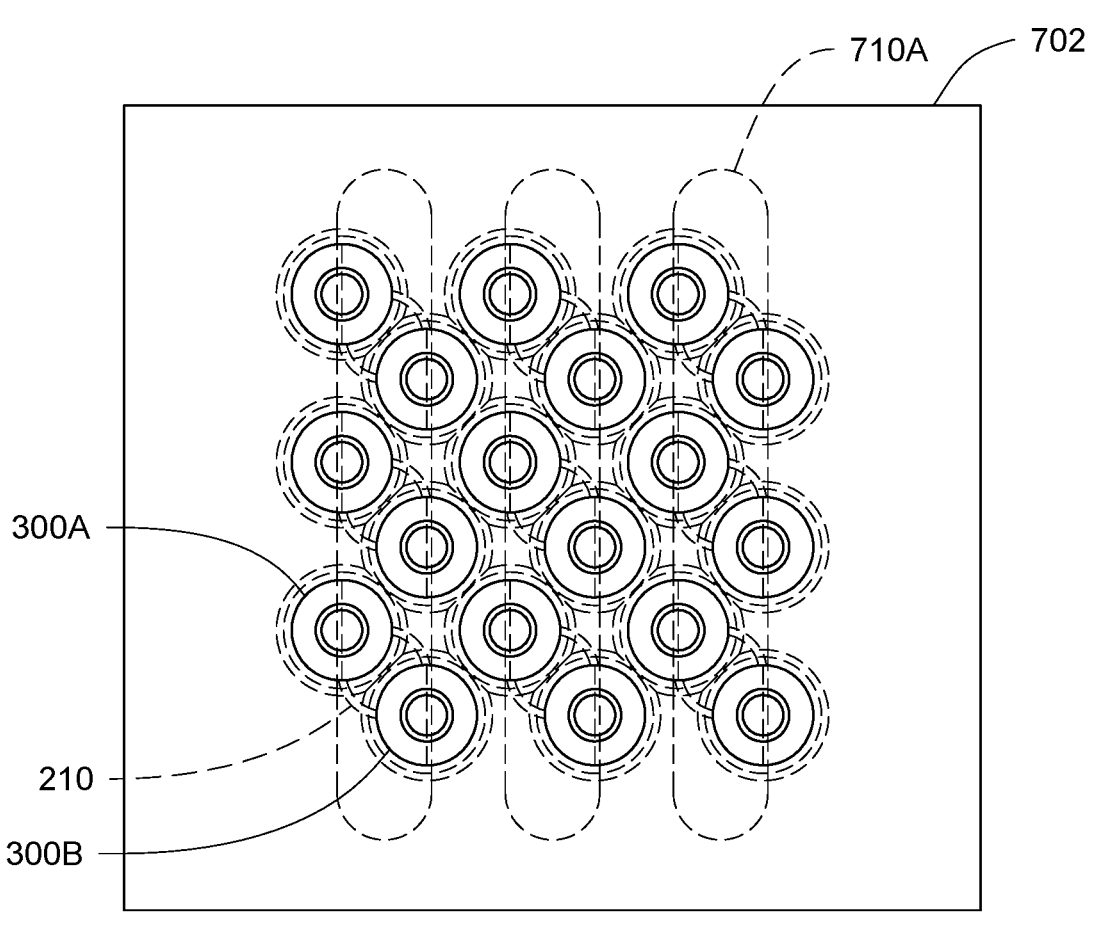
FIG. 13 is a bottom plan view of spring assemblies accommodated in a housing and contacting terminals of a DUT, according to an embodiment.

FIG. 13 is a bottom plan view of spring assemblies (300A, 300B) accommodated in a housing 702 and contacting terminals 210 of a DUT 200, according to an embodiment.

The middle of the spring assemblies (300A, 300B) are the ends of the bottoms of the spring probes. A distance between the end of the bottom of the spring probe 300A (e.g., a force/sense spring probe) and the end of the bottom of its corresponding spring probe 300B (e.g., a sense/force spring probe) can be the pad(s) spacing of the load board. Such distance can be relatively big compared with the spacing of the tips of the spring assembly, and can make the load board manufacturing easier.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

Aspects

It is noted that any one of aspects below can be combined with each other.

Aspect 1. A spring probe assembly for a Kelvin testing system for testing integrated circuit devices, comprising:
a force spring probe and a sense spring probe,
wherein the force spring probe and the sense spring probe are generally identical to each other in shape and size,
wherein each of the force spring probe and the sense spring probe includes a head; a body containing at least one spring; and a bottom,
wherein the body has a cylindrical shape, the head and the body have a same diameter in an end view,
wherein the head includes a base and a top integrated with the base, the base has a cylindrical shape, the top includes a half-cylinder and an apex, and a straight edge and a curved edge extending from the apex,
wherein the head includes a shoulder between the base and the top,
wherein the force spring probe and the sense spring probe are disposed so that the apexes of the force spring probe and the sense spring probe are adjacent to each other.

Aspect 2. The spring probe assembly according to aspect 1, wherein the apex has a tilted angle ranging from at or about 30 degrees to at or about 60 degrees.

Aspect 3. The spring probe assembly according to aspect 2, wherein the angle is at or about 45 degrees.

Aspect 4. The spring probe assembly according to any one of aspects 1-3, wherein a diameter of the base is at or about 200 microns.

Aspect 5. The spring probe assembly according to any one of aspects 1-4, wherein a distance between the apexes of the force spring probe and the sense spring probe is at or about 70 microns.

Aspect 6. The spring probe assembly according to any one of aspects 1-5, wherein the head is made of a homogenous metal alloy.

Aspect 7. A Kelvin testing system for testing integrated circuit devices, comprising:
a device under test;
a load board; and
a spring probe assembly including:
a force spring probe and a sense spring probe,
wherein the force spring probe and the sense spring probe are generally identical to each other in shape and size,
wherein each of the force spring probe and the sense spring probe includes a head; a body containing at least one spring; and a bottom,
wherein the body has a cylindrical shape, the head and the body have a same diameter in an end view,
wherein the head includes a base and a top integrated with the base, the base has a cylindrical shape, the top includes a half-cylinder and an apex, and a straight edge and a curved edge extending from the apex,
wherein the head includes a shoulder between the base and the top,
wherein the force spring probe and the sense spring probe are disposed so that the apexes of the force spring probe and the sense spring probe are adjacent to each other.

Aspect 8. The testing system according to aspect 7, wherein the apex has a tilted angle ranging from at or about 30 degrees to at or about 60 degrees.

Aspect 9. The testing system according to aspect 8, wherein the angle is at or about 45 degrees.

Aspect 10. The testing system according to any one of aspects 7-9, wherein a diameter of the base is at or about 200 microns.

Aspect 11. The testing system according to any one of aspects 7-10, wherein a distance between the apexes of the force spring probe and the sense spring probe is at or about 70 microns.

Aspect 12. The testing system according to any one of aspects 7-11, wherein the head is made of a homogenous metal alloy.

Aspect 13. The testing system according to any one of aspects 7-12, wherein the device under test is a ball grid array device or a quad-flat no-leads device.

Aspect 14. The testing system according to any one of aspects 7-13, wherein the device under test is a 0.35-millimeter pitch device.

Aspect 15. The testing system according to any one of aspects 7-14, wherein the device under test is a 0.3-millimeter pitch device.

Aspect 16. The testing system according to any one of aspects 7-15, further comprising:
    a housing,
    wherein the force spring probe and/or the sense spring probe is disposed inside the housing.

Aspect 17. The testing system according to aspect 16, wherein the housing includes a wall having a thickness of 40 microns.

Aspect 18. The testing system according to aspect 16 or aspect 17, wherein the housing includes a slot accommodating the top.

Aspect 19. The testing system according to any one of aspects 16-18, wherein the housing includes an up-stop configured to prevent the shoulder from moving towards the device under test.

Aspect 20. A method of forming a spring probe assembly in a Kelvin testing system for testing integrated circuit devices, the method comprising:
    cutting a cylinder by a plane containing an axis of symmetry of the cylinder to form a half-cylinder;
    rotating the plane 90 degrees about the axis of symmetry of the cylinder;
    tilting the plane at an angle with respect to a circular cross-section of the cylinder;
    cutting the half-cylinder by the plane to form a shape of a top;
    installing the spring probe assembly having the top into a housing from a bottom of the housing;
    loading the housing having the spring probe assembly onto a load board; and
    loading a device under test on the housing.

Aspect 21. A method of forming a housing for a spring probe in a Kelvin testing system for testing integrated circuit devices, the method comprising:
    forming a housing material for the spring probe;
    drilling or forming a hole from a bottom of the housing material;
    cutting or forming a slot from a top of the housing material so that the slot intersects or partially overlaps the hole to form the housing for the spring probe;
    wherein a centerline of the slot is offset from a centerline of the hole,
    an edge of the slot is tangent to a side of the hole, and
    a bottom of the slot is flat.

Aspect 22. A housing for a spring probe for a Kelvin testing system for testing integrated circuit devices, comprising:
    a hole extending from a bottom of the housing; and
    a slot extending from a top of the housing,

wherein the slot intersects or partially overlaps the hole,
a centerline of the slot is offset from a centerline of the hole,
an edge of the slot is tangent to a side of the hole, and
a bottom of the slot is flat.

Aspect 23. A spring probe assembly for a Kelvin testing system for testing integrated circuit devices, comprising:
    a force spring probe and a sense spring probe,
    wherein the force spring probe and the sense spring probe are generally identical to each other in shape and size,
    wherein each of the force spring probe and the sense spring probe includes a head; a body; and a bottom,
    wherein the body has a cylindrical shape,
    wherein the head includes a base and a top integrated with the base, the base has a cylindrical shape, the top is a half-cylinder with a flat front portion and an angular tip portion, the angular tip portion has a chisel point apex; a curved edge extending from the apex; and a straight edge extending from the apex,
    wherein the head includes a shoulder between the base and the top,
    wherein the force spring probe and the sense spring probe are disposed so that the apex of the force spring probe and the apex of sense spring probe are oriented adjacent to each other.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:
1. A spring probe assembly for a Kelvin testing system for testing integrated circuit devices, comprising:
    a force spring probe and a sense spring probe,
    wherein the force spring probe and the sense spring probe are generally identical to each other in shape and size,
    wherein each of the force spring probe and the sense spring probe includes a head; a body containing at least one resilient element; and a bottom,
    wherein the body has a cylindrical shape, the head and the body have a same diameter in an end view,
    wherein the head includes a base and a top integrated with the base, the base has a cylindrical shape, the top includes a half-cylinder and an apex, and a straight edge and a curved edge on a flat surface of the top extending from the apex,
    wherein the top has a flat side surface perpendicular to a flat upper surface of the base, the top has a right-angle trapezoid shape in a side view as viewed in a direction facing the flat side surface of the top,
    wherein the head includes a shoulder between the base and the top, wherein the force spring probe and the sense spring probe are disposed so that the apexes of the force spring probe and the sense spring probe are adjacent to each other.

2. The spring probe assembly according to claim 1, wherein the apex has a tilted angle ranging from at or about 30 degrees to at or about 60 degrees.

3. The spring probe assembly according to claim 2, wherein the angle is at or about 45 degrees.

4. The spring probe assembly according to claim 1, wherein a diameter of the base is at or about 200 microns.

5. The spring probe assembly according to claim 1, wherein a distance between the apexes of the force spring probe and the sense spring probe is at or about 70 microns.

6. The spring probe assembly according to claim 1, wherein the head is made of a homogenous metal alloy.

7. The spring probe assembly according to claim 1, wherein the top has a quarter circle shape above a rectangular shape in a side view as viewed in a direction facing a plane perpendicular to the flat side surface of the top.

8. The spring probe assembly according to claim 7, wherein the cylindrical shape of the base and the cylindrical shape of the body have a same diameter.

9. The spring probe assembly according to claim 8, wherein the cylindrical shape of the body extends from a bottom surface of the base to an end of the body.

10. A Kelvin testing system for testing integrated circuit devices, comprising:
   a device under test;
   a load board; and
   a spring probe assembly including:
      a force spring probe and a sense spring probe,
      wherein the force spring probe and the sense spring probe are generally identical to each other in shape and size,
      wherein each of the force spring probe and the sense spring probe includes a head;
   a body containing at least one resilient element; and a bottom,
      wherein the body has a cylindrical shape, the head and the body have a same diameter in an end view,
      wherein the head includes a base and a top integrated with the base, the base has a cylindrical shape, the top includes a half-cylinder and an apex, and a straight edge and a curved edge on a flat surface of the top extending from the apex,
      wherein the top has a flat side surface perpendicular to a flat upper surface of the base, the top has a right-angle trapezoid shape in a side view as viewed in a direction facing the flat side surface of the top,
      wherein the head includes a shoulder between the base and the top,
      wherein the force spring probe and the sense spring probe are disposed so that the apexes of the force spring probe and the sense spring probe are adjacent to each other.

11. The testing system according to claim 10, wherein the apex has a tilted angle ranges from at or about 30 degrees to at or about 60 degrees.

12. The testing system according to claim 10, wherein the head is made of a homogenous metal alloy.

13. The testing system according to claim 10, wherein the device under test is a ball grid array device or a quad-flat no-leads device.

14. The testing system according to claim 10, wherein the device under test is a 0.35-millimeter pitch device.

15. The testing system according to claim 10, wherein the device under test is a 0.3-millimeter pitch device.

16. The testing system according to claim 10, further comprising:
   a housing,
   wherein the force spring probe and/or the sense spring probe is disposed inside the housing.

17. The testing system according to claim 16, wherein the housing includes a wall having a thickness of 40 microns.

18. The testing system according to claim 16, wherein the housing includes a slot accommodating the top.

19. The testing system according to claim 16, wherein the housing includes an up-stop configured to prevent the shoulder from moving towards the device under test.

20. A spring probe assembly for a Kelvin testing system for testing integrated circuit devices, comprising:
   a force spring probe and a sense spring probe,
   wherein the force spring probe and the sense spring probe are generally identical to each other in shape and size,
   wherein each of the force spring probe and the sense spring probe includes a head; a body; and a bottom,
   wherein the body has a cylindrical shape,
   wherein the head includes a base and a top integrated with the base, the base has a cylindrical shape, the top is a half-cylinder with a flat front portion and an angular tip portion, the angular tip portion has a chisel point apex; a curved edge on a flat surface of the top extending from the apex; and a straight edge on the flat surface of the top extending from the apex,
   wherein the flat front portion of the half-cylinder is perpendicular to a flat upper surface of the base, the top has a right-angle trapezoid shape in a side view as viewed in a direction facing the flat front portion of the half-cylinder,
   wherein the head includes a shoulder between the base and the top,
   wherein the force spring probe and the sense spring probe are disposed so that the apex of the force spring probe and the apex of sense spring probe are oriented adjacent to each other.

* * * * *